(12) United States Patent
Hwang et al.

(10) Patent No.: US 9,105,860 B2
(45) Date of Patent: Aug. 11, 2015

(54) ORGANIC LIGHT EMITTING DIODE

(75) Inventors: Seok-Hwan Hwang, Yongin (KR);
Young-Kook Kim, Yongin (KR);
Hye-Jin Jung, Yongin (KR); Jin-O Lim,
Yongin (KR); Sang-Hyun Han, Yongin
(KR); Hee-Joo Ko, Yongin (KR);
Jong-Hyuk Lee, Yongin (KR);
Chang-Ho Lee, Yongin (KR)

(73) Assignee: Samsung Display Co., Ltd., Yongin,
Gyeonggi-Do (KR)

( * ) Notice: Subject to any disclaimer, the term of this patent is extended or adjusted under 35 U.S.C. 154(b) by 647 days.

(21) Appl. No.: 13/451,285

(22) Filed: Apr. 19, 2012

(65) Prior Publication Data

US 2013/0001532 A1    Jan. 3, 2013

(30) Foreign Application Priority Data

Jun. 30, 2011   (KR) .................. 10-2011-0064985
Mar. 7, 2012    (KR) .................. 10-2012-0023622

(51) Int. Cl.
| H01L 51/50 | (2006.01) |
| H01L 51/00 | (2006.01) |
| H01L 51/52 | (2006.01) |
| H01L 27/32 | (2006.01) |

(52) U.S. Cl.
CPC ........ *H01L 51/5056* (2013.01); *H01L 51/0058* (2013.01); *H01L 51/0059* (2013.01); *H01L 51/5265* (2013.01); *H01L 27/3211* (2013.01)

(58) Field of Classification Search
None
See application file for complete search history.

(56) References Cited

U.S. PATENT DOCUMENTS

| 5,220,348 | A | 6/1993 | D'Aurelio |
| 5,256,506 | A | 10/1993 | Ellis et al. |
| 5,278,023 | A | 1/1994 | Bills et al. |
| 5,308,737 | A | 5/1994 | Bills et al. |
| 5,998,085 | A | 12/1999 | Isberg et al. |
| 6,097,147 | A | 8/2000 | Baldo et al. |
| 6,114,088 | A | 9/2000 | Wolk et al. |
| 6,214,520 | B1 | 4/2001 | Wolk et al. |
| 6,303,238 | B1 | 10/2001 | Thompson et al. |
| 6,310,360 | B1 | 10/2001 | Forrest et al. |
| 2006/0017377 | A1 | 1/2006 | Ryu |
| 2007/0001570 | A1* | 1/2007 | Nomura et al. ............... 313/113 |
| 2007/0231503 | A1* | 10/2007 | Hwang et al. .................. 428/1.1 |
| 2010/0025669 | A1 | 2/2010 | Hwang et al. |
| 2011/0240965 | A1* | 10/2011 | Yoon et al. ....................... 257/40 |

FOREIGN PATENT DOCUMENTS

| JP | 2005-005159 | 1/2005 |
| KP | 10-2010-0007552 A | 1/2010 |
| KR | 1020040104225 A | 12/2004 |
| KR | 10-2006-0007899 A | 1/2006 |
| KR | 10-2007-0114562 A | 12/2007 |

(Continued)

OTHER PUBLICATIONS

Let et.al., Synthesis and Electroluminescent Properties of Blue Fluorescent Triphenylamine Substituted Anthracenes for OLEDs, 2010, Molecular Crystals and Liquid Crystals, vol. 530, "STN Abstract Only".*

*Primary Examiner* — Gregory Clark
(74) *Attorney, Agent, or Firm* — Knobbe Martens Olson & Bear LLP

(57) ABSTRACT

A full color organic light emitting diode having high efficiency and high color purity while having low manufacturing costs due to simple manufacturing processes.

20 Claims, 2 Drawing Sheets

(56) References Cited

FOREIGN PATENT DOCUMENTS

| KR | 1020080054547 A | | 6/2008 | |
| KR | 10-0846586 B1 | | 7/2008 | |
| KR | 10-2010-0007552 | * | 1/2010 | ............. C07C 15/28 |
| KR | 10-2010-0013165 A | | 2/2010 | |

* cited by examiner

ORGANIC LIGHT EMITTING DIODE

CROSS-REFERENCE TO RELATED APPLICATIONS

This application claims the benefit of Korean Patent Applications Nos. 10-2011-0064985, filed on Jun. 30, 2011, and 10-2012-0023622, filed on Mar. 7, 2012, in the Korean Intellectual Property Office, the disclosure of which is incorporated herein in its entirety by reference.

BACKGROUND

1. Field

The present embodiments relate to a full color organic light emitting diode having simple manufacturing processes while having high efficiency and high color purity.

2. Description of the Related Technology

An organic light emitting diode is a self-emitting type display device, and not only has a wide viewing angle and improved contrast, but also has a quick response speed, improved luminance, improved driving voltage, and an improved response speed, and is capable of a polychrome.

An organic light emitting diode may generally have a structure where an anode is formed on a substrate, and a hole transport layer (HTL), an emission layer, an electron transport layer (ETL), and a cathode are sequentially formed on the anode. Here, the HTL, the emission layer, and the ETL are organic thin films comprising an organic compound.

The organic light emitting diode having such a structure may operate as follows.

When a voltage is applied between the anode and the cathode, holes injected from the anode move to the emission layer through the HTL, and electrons injected from the cathode move to the emission layer through the ETL. Carriers such as the holes and electrons recombine in the emission layer to generate excitons. Then, light is generated as the excitons change from an excited state to a base state.

SUMMARY

The present embodiments provide an organic light emitting diode having simple manufacturing processes while having high efficiency and high color purity.

According to an aspect of the present embodiments, there is provided an organic light emitting diode including: a substrate including a first sub-pixel, a second sub-pixel, and a third sub-pixel; a first electrode disposed according to the first, second, and third sub-pixels of the substrate; a second electrode facing the first electrode; a first emission layer disposed between the first electrode and the second electrode in the first sub-pixel, and emitting a first color light; a second emission layer disposed between the first electrode and the second electrode in the second sub-pixel, and emitting a second color light; and a hole transporting third emission layer being a common layer disposed throughout the first sub-pixel, the second sub-pixel, and the third sub-pixel, wherein the first electrode is a reflective electrode and the second electrode is a translucent electrode, or the first electrode is a translucent electrode and the second electrode is a reflective electrode.

The hole transporting third emission layer may include at least one of a compound represented by Formula 1 below and a compound represented by Formula 2 below:

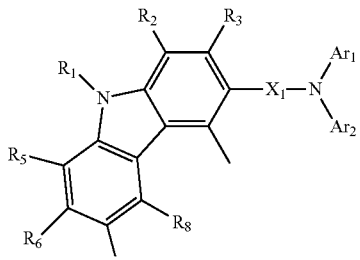

<Formula 1>

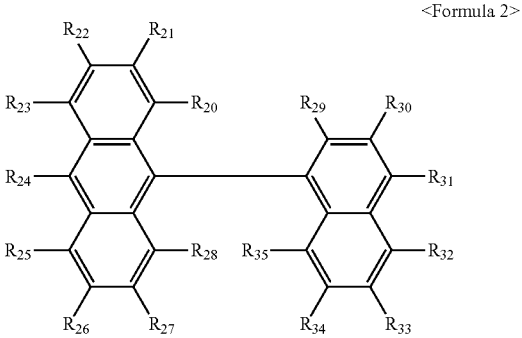

<Formula 2> wherein, in Formulas 1 and 2, each of $R_1$ through $R_8$ and $R_{20}$ through $R_{35}$ is independently one of hydrogen, heavy hydrogen (e.g. deuterium, tritium), a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_5$-$C_{50}$ aryl group, a substituted or unsubstituted $C_5$-$C_{50}$ aryloxy group, a substituted or unsubstituted $C_5$-$C_{50}$ arylthio group, a substituted or unsubstituted $C_2$-$C_{50}$ heteroaryl group, $-(X_2)_a-N(R_{40})(R_{41})$, and $(X_3)_b-Si(R_{42})(R_{43})(R_{44})$; each of $X_1$ through $X_3$ is independently one of a substituted or unsubstituted $C_5$-$C_{50}$ arylene group and a substituted or unsubstituted $C_2$-$C_{50}$ heteroarylene group; each of $Ar_1$ and $Ar_2$ is independently one of a substituted or unsubstituted $C_5$-$C_{50}$ aryl group and a substituted or unsubstituted $C_2$-$C_{50}$ heteroaryl group; each of $R_{40}$ through $R_{44}$ is independently one of hydrogen, heavy hydrogen (e.g. deuterium, tritium), a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_5$-$C_{50}$ aryl group, a substituted or unsubstituted $C_5$-$C_{50}$ aryloxy group, a substituted or unsubstituted $C_5$-$C_{50}$ arylthio group, and a substituted or unsubstituted $C_2$-$C_{50}$ heteroaryl group; and each of a and b is independently an integer from 0 to 5.

The hole transporting third emission layer may further include, aside from the at least one of compounds represented by Formulas 1 and 2, at least one of a phosphorescent dopant and a fluorescent dopant.

The first color light may be a red light, the second color light may be a green light, and a third color light emitted from the hole transporting third emission layer may be a blue light.

The hole transporting third emission layer may include a first region disposed in the first sub-pixel, a second region disposed in the second sub-pixel, and a third region disposed in the third sub-pixel, wherein the first region may transport holes from the first electrode to the first emission layer, the second region may transport holes from the first electrode to the second emission layer, and the third region may emit the third color light.

The organic light emitting diode may satisfy Equations 1 through 3 below:

$$\frac{\lambda_1}{2n_1} \cdot m_1 - \frac{\lambda_1}{10} \leq L_1 \leq \frac{\lambda_1}{2n_1} \cdot m_1 + \frac{\lambda_1}{10} \quad \text{<Equation 1>}$$

$$\frac{\lambda_2}{2n_2} \cdot m_2 - \frac{\lambda_2}{10} \leq L_2 \leq \frac{\lambda_2}{2n_2} \cdot m_2 + \frac{\lambda_2}{10} \quad \text{<Equation 2>}$$

$$\frac{\lambda_3}{2n_3} \cdot m_3 - \frac{\lambda_3}{10} \leq L_3 \leq \frac{\lambda_3}{2n_3} \cdot m_3 + \frac{\lambda_3}{10} \quad \text{<Equation 3>}$$

wherein, in Equations 1 through 3, $L_1$ denotes a distance between the first electrode and the second electrode in the first sub-pixel; $L_2$ denotes a distance between the first electrode and the second electrode in the second sub-pixel; $L_3$ denotes a distance between the first electrode and the second electrode in the third sub-pixel; $\lambda_1$, $\lambda_2$, and $\lambda_3$ respectively denote wavelengths of the first color light, the second color light, and the third color light; $n_1$ denotes a refractive index of layers disposed between the first electrode and the second electrode in the first sub-pixel; $n_2$ denotes a refractive index of layers disposed between the first electrode and the second electrode in the second sub-pixel; $n_3$ denotes a refractive index of layers disposed between the first electrode and the second electrode in the third sub-pixel; and each of $m_1$, $m_2$, and $m_3$ is independently a natural number.

In Equations 1 through 3, each of $m_1$, $m_2$, and $m_3$ may be 1. $D_1$ may denote a distance between the first electrode and the first emission layer in the first sub-pixel, and $D_1$ may be in the range from 400 Å to 1000 Å. $D_2$ may denote a distance between the first electrode and the second emission layer in the second sub-pixel, and $D_2$ may be in the range from 300 Å to 900 Å. $D_3$ may denote a sum of a distance between the first electrode and the hole transporting third emission layer in the third sub-pixel and a thickness of the hole transporting third emission layer, and $D_3$ may be in the range from 200 Å to 800 Å.

In Equations 1 through 3, each of $m_1$, $m_2$, and $m_3$ may be 2. $D_1$ may denote a distance between the first electrode and the first emission layer in the first sub-pixel, and $D_1$ may be in the range from 1600 Å to 2300 Å. $D_2$ may denote a distance between the first electrode and the second emission layer in the second sub-pixel, and $D_2$ may be in the range from 1300 Å to 2000 Å. $D_3$ may denote a sum of a distance between the first electrode and the hole transporting third emission layer in the third sub-pixel and a thickness of the hole transporting third emission layer, and $D_3$ may be in the range from 900 Å to 1800 Å.

$D_1$ may denote a distance between the first electrode and the first emission layer in the first sub-pixel, $D_2$ may denote a distance between the first electrode and the second emission layer in the second sub-pixel, $D_3$ may denote a sum of a distance between the first electrode and the hole transporting third emission layer in the third sub-pixel and a thickness of the hole transporting third emission layer, and $D_1 > D_2 = D_3$ or $D_1 > D_2 > D_3$.

A first auxiliary layer may be disposed between the hole transporting third emission layer and the first emission layer.

A hole injection layer or a functional layer having both a hole injection function and a hole transport function may be disposed between the hole transporting third emission layer and the first electrode, and the hole injection layer or the functional layer may contact the hole transporting third emission layer.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION

Hereinafter, the present embodiments will be described more fully with reference to the accompanying drawings, in which example embodiments are shown.

Figure 1:
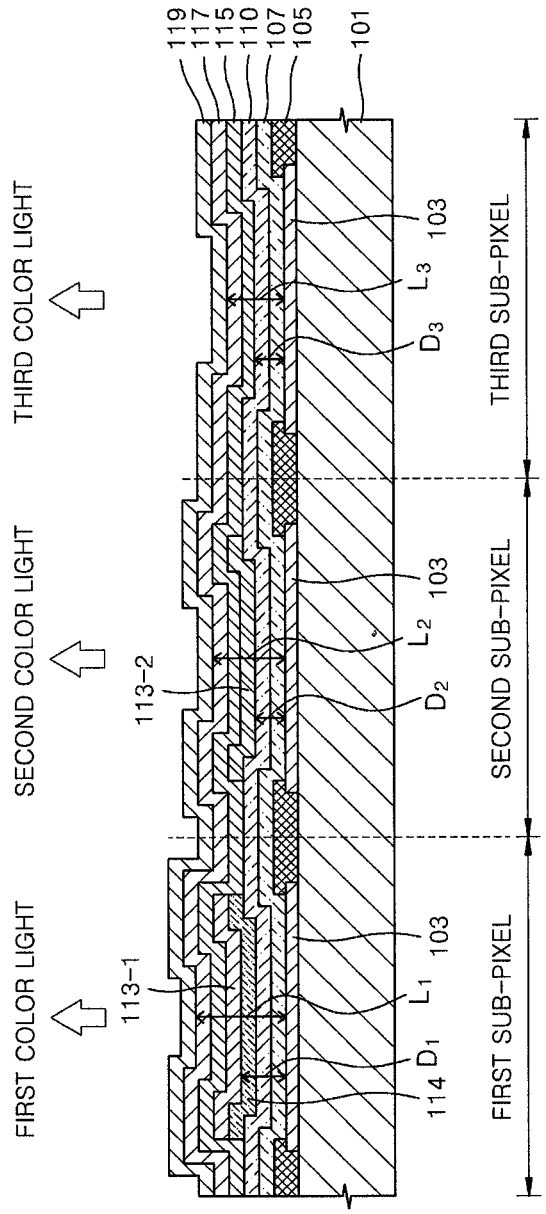
FIG. 1 is a cross-sectional view schematically illustrating an organic light emitting diode according to an embodiment.

FIG. 1 is a cross-sectional view schematically illustrating an organic light emitting diode 100 according to an embodiment. A structure of the organic light emitting diode 100 and a method of manufacturing the organic light emitting diode 100 will now be described with reference to FIG. 1.

Referring to the organic light emitting diode 100 of FIG. 1, a substrate 101 includes a first sub-pixel, a second sub-pixel, and a third sub-pixel. A first electrode 103 is patterned according to the first sub-pixel, the second sub-pixel, and the third sub-pixel. A hole injection layer (HIL) 107 and a hole transporting third emission layer 110 are sequentially disposed on the first electrode 103, wherein the HIL 107 and the hole transporting third emission layer 110 are a common layer disposed throughout the first through third sub-pixels. A first auxiliary layer 114 and a first emission layer 113-1 emitting a first color light are sequentially disposed on the hole transporting third emission layer 110 in the first sub-pixel, and a second emission layer 113-2 emitting a second color light is disposed on the hole transporting third emission layer 110 in the second sub-pixel. An electron transport layer (ETL) 115, an electron injection layer (EIL) 117, and a second electrode 119 are sequentially disposed thereon throughput the first through third sub-pixels, as a common layer.

Herein, a "common layer" denotes a layer disposed throughout first, second, and third sub-pixels, without being patterned according to the first, second, and third sub-pixels.

The first color light, the second color light, and a third color light are respectively red, green, and blue lights. Accordingly, the organic light emitting diode 100 may emit a full color. Here, the first through third color lights are not limited to red, green, and blue lights as long as a mixed light of the first through third color lights is a white light.

A substrate generally used in an organic light emitting diode may be used as the substrate 101. Here, a glass substrate or transparent plastic substrate having good mechanical strength, thermal stability, transparency, surface flatness, handling convenience, and waterproofing property.

The first electrode 103 that is patterned according to the first through third sub-pixels is disposed on the substrate 101. The first electrode 103 is a reflective electrode. Accordingly, the first through third color lights pass through the second electrode 119 and are emitted in a direction opposite to the substrate 101.

The first electrode 103 may be disposed by providing a material for forming a first electrode on the substrate 101 via a deposition method, a sputtering method, or the like. If the first electrode 103 is an anode, the material for forming a first electrode may have a high work function so that holes are easily injected into the first emission layer 113-1, the second emission layer 113-2, and the hole transporting third emission layer 110.

In order to have a reflective property, the first electrode 103 may include at least one metal, such as magnesium (Mg), aluminum (Al), aluminum-lithium (Al—Li), calcium (Ca), magnesium-indium (Mg—In), or magnesium-silver (Mg—Ag). Also, aside from the above at least one metal, the first electrode 103 may further include an indium tin oxide (ITO), an indium zinc oxide (IZO), a tin oxide (SnO2), or a zinc oxide (ZnO), which are transparent and have good conductivity.

A pixel insulation film 105 is formed on an edge portion of the first electrode 103. The pixel insulation film 105 defines a pixel region, and may include any well known organic insulation material (for example, a silicon-based material), any well known inorganic insulation material, or any well known organic/inorganic complex insulation material.

The HIL 107 is disposed on the first electrode 103 as a common layer. The HIL 107 may be disposed by contacting the first electrode 103.

The HIL 107 may be disposed on the first electrode 103 by using any one of various methods, such as a vacuum deposition method, a spin coating method, a cast method, an LB method, an inkjet printing method, a laser printing method, and a laser thermal transfer method.

When the HIL 107 is disposed by using a vacuum deposition method, deposition conditions may differ according to a compound used as a material of the HIL 107, and a target structure and target thermal characteristics of the HIL 107, but for example, a deposition temperature may be from about 100 to about 500° C., a vacuum level may be from about $10^{-8}$ to about $10^{-3}$ torr, and a deposition rate may be from about 0.01 to about 100 Å/sec. However, the deposition conditions are not limited thereto.

When the HIL 107 is disposed by using a spin coating method, coating conditions may differ according to a compound used as a material of the HIL 107, and a target structure and target thermal characteristics of the HIL 107, but for example, a coating rate may be from about 2000 to about 5000 rpm and a thermal process temperature for removing a solvent after coating may be from about 80° C. to about 200° C. However, the coating conditions are not limited thereto.

The HIL 107 may comprise a well known hole injection material. For example, the HIL 107 may comprise N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4''-tris(3-methylphenylphenylamino)triphenylamine (m-MTDATA), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), or polyaniline/poly(4-styrenesulfonate) (PANI/PSS), but a material for forming the HIL 107 is not limited thereto.

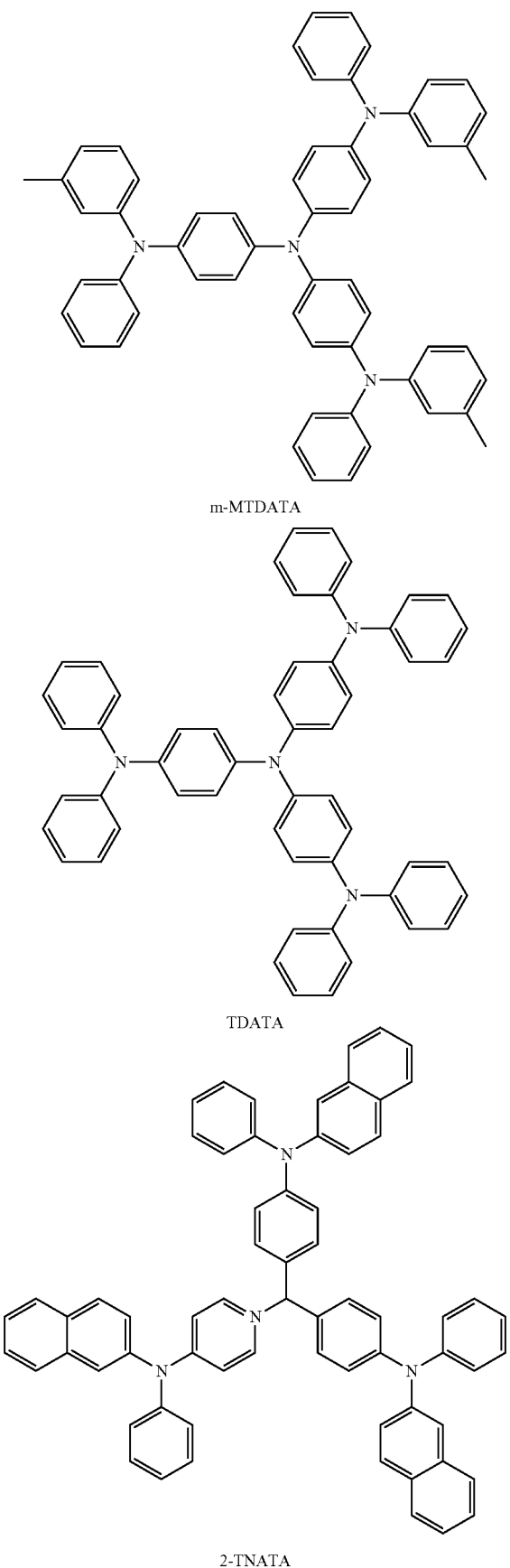

A thickness of the HIL 107 may be from about 100 Å to about 10000 Å, for example, from about 100 Å to about 1500 Å. If the thickness of the HIL 107 is within the above range, the organic light emitting diode 100 substantially having no increase of a driving voltage may be realized.

The HIL 107 may further include a charge-generating material, aside from the hole injection material described above, so as to improve conductivity of the HIL 107.

The charge-generating material may be a p-dopant. Examples of the p-dopant unlimitedly include quinone derivatives such as tetracyanoquinodimethane (TCNQ) and 2,3,5,6-tetrafluoro-tetracyano-1,4-benzoquinondimethane (F4TCNQ); metal oxides such as a tungsten oxide and a molybdenum oxide; and cyano group-containing compounds such as a compound 100 below.

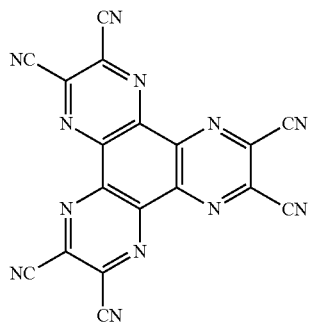

<Compound 100>

If the HIL 107 further includes the charge-generating material, the charge-generating material may be homogeneously or heterogeneously dispersed in the HIL 107.

The hole transporting third emission layer 110 is disposed on the HIL 107 as a common layer. The HIL 107 and the hole transporting third emission layer 110 contact each other.

The hole transporting third emission layer 110 may be disposed on the HIL 107 by using a method such as a vacuum deposition method, a spin coating method, a cast method, an LB method, an inkjet printing method, a laser printing method, or a laser thermal transfer method. If the hole transporting third emission layer 110 is disposed by using the vacuum deposition method or the spin coating method, deposition conditions may differ according to a used compound, but may be generally selected from the similar conditions of disposing the HIL 107.

The hole transporting third emission layer 110 includes a first region disposed in the first sub-pixel, a second region disposed in the second sub-pixel, and a third region disposed in the third sub-pixel, wherein the first region may transport holes from the first electrode 103 to the first emission layer 113-1, the second region may transport holes from the first electrode 103 to the second emission layer 113-2, and the third region may emit the third color light. In other words, the third color light is not substantially emitted by the hole transporting third emission layer 110 in the first and second sub-pixels.

The hole transporting third emission layer 110 may include a compound having both a hole transport function and a third color light emitting function. For example, when the third color light is a blue light, the hole transporting third emission layer 110 may include a compound having both a hole transport function and a blue light emitting function.

For example, the hole transporting third emission layer 110 may include at least one of a compound represented by Formula 1 below and a compound represented by Formula 2 below:

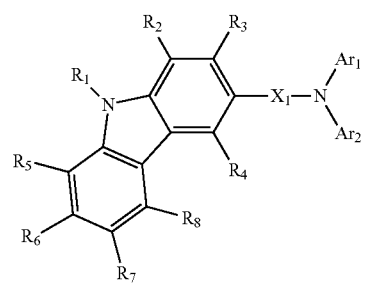

<Formula 1>

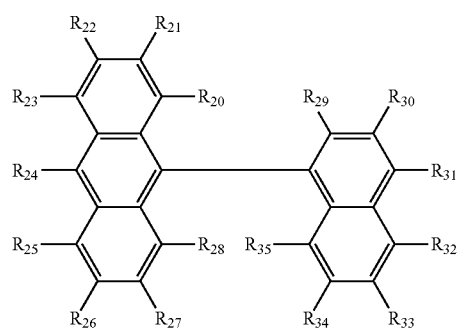

<Formula 2>

In Formulas 1 and 2, each of $R_1$ through $R_8$ and $R_{20}$ through $R_{35}$ is independently one of hydrogen, heavy hydrogen (e.g. deuterium, tritium), a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_5$-$C_{50}$ aryl group, a substituted or unsubstituted $C_5$-$C_{50}$ aryloxy group, a substituted or unsubstituted $C_5$-$C_{50}$ arylthio group, a substituted or unsubstituted $C_2$-$C_{50}$ heteroaryl group, —$(X_2)_a$—$N(R_{40})(R_{41})$, and —$(X_3)_b$—$Si(R_{42})(R_{43})(R_{44})$;

each of $X_1$ through $X_3$ is independently one of a substituted or unsubstituted $C_5$-$C_{50}$ arylene group and a substituted or unsubstituted $C_2$-$C_{50}$ heteroarylene group;

each of $Ar_1$ through $Ar_2$ is independently one of a substituted or unsubstituted $C_5$-$C_{50}$ aryl group and a substituted or unsubstituted $C_2$-$C_{50}$ heteroaryl group;

each of $R_{40}$ through $R_{44}$ is independently one of hydrogen, heavy hydrogen (e.g. deuterium, tritium), a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_5$-$C_{50}$ aryl group, a substituted or unsubstituted $C_5$-$C_{50}$ aryloxy group, a substituted or unsubstituted $C_5$-$C_{50}$ arylthio group, and a substituted or unsubstituted $C_2$-$C_{50}$ heteroaryl group; and each of a and b is independently an integer from 0 to 5.

For example, in Formulas 1 and 2, each of $R_1$ through $R_8$ and $R_{20}$ through $R_{35}$ is independently hydrogen, heavy hydrogen (e.g. deuterium, tritium), a halogen atom, a hydroxyl group, a cyano group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{14}$ aryl group, a substituted or unsubstituted $C_3$-$C_{14}$ heteroaryl group, or —$(X_2)_a$—$N(R_{40})(R_{41})$, but is not limited thereto. Here, each of $R_{40}$ and $R_{41}$ is independently hydrogen, heavy hydrogen (e.g. deuterium, tritium), a halogen atom, a hydroxyl group, a cyano group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{14}$ aryl group, or a substituted or unsubstituted $C_3$-$C_{14}$ heteroaryl group, but is not limited thereto.

In detail, each of $R_1$ through $R_8$ and $R_{20}$ through $R_{35}$ is independently hydrogen, heavy hydrogen (e.g. deuterium, tritium), a halogen atom, a hydroxyl group, a cyano group, a methyl group, an ethyl group, a propyl group, a butyl group, a pentyl group, an ethenyl group, a prophenyl group, a butenyl group, a pentenyl group, an acetyl group, a methoxy group, an ethoxy group, a propoxy group, a butoxy group, a pentoxy group, a substituted or unsubstituted phenyl group, a substituted or unsubstituted pentalenyl group, a substituted or unsubstituted indenyl group, a substituted or unsubstituted naphthyl group, a substituted or unsubstituted azulenyl, a substituted or unsubstituted heptalenyl, a substituted or unsubstituted indacenyl, a substituted or unsubstituted acenaphthyl group, a substituted or unsubstituted fluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenylenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted pyrazolyl group, a substituted or unsubstituted imidazolyl group, a substituted or unsubstituted imidazolinyl group, a substituted or unsubstituted imidazopyridinyl group, a substituted or unsubstituted imidazopyrimidinyl group, a substituted or unsubstituted pyridinyl group, a substituted or unsubstituted pyrazinyl group, a substituted or unsubstituted pyrimidinyl group, a substituted or unsubstituted indolyl group, a substituted or unsubstituted purinyl group, a substituted or unsubstituted quinolinyl group, a substituted or unsubstituted phthalazinyl group, a substituted or unsubstituted indolizinyl group, a substituted or unsubstituted naphthyridinyl group, a substituted or unsubstituted quinazolinyl group, a substituted or unsubstituted cinnolinyl group, a substituted or unsubstituted indazolyl group, a substituted or unsubstituted carbazolyl group, a substituted or unsubstituted phenazinyl group, a substituted or unsubstituted phenanthridinyl group, a substituted or unsubstituted pyranyl group, a substituted or unsubstituted chromenyl group, a substituted or unsubstituted benzofuranyl group, a substituted or unsubstituted thiophenyl group, a substituted or unsubstituted benzothiophenyl group, a substituted or unsubstituted isothiazolyl group, a substituted or unsubstituted benzoimidazolyl group, or a substituted or unsubstituted isoxazolyl group, or —$(X_2)_a$—$N(R_{40})(R_{41})$, but is not limited thereto. Here, each of $R_{40}$ and $R_{41}$ is independently a substituted or unsubstituted phenyl group, a substituted or unsubstituted pentalenyl group, a substituted or unsubstituted indenyl group, a substituted or unsubstituted naphthyl group, a substituted or unsubstituted azulenyl, a substituted or unsubstituted heptalenyl, a substituted or unsubstituted indacenyl, a substituted or unsubstituted acenaphthyl group, a substituted or unsubstituted fluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted pyrazolyl group, a substituted or unsubstituted imidazolyl group, a substituted or unsubstituted imidazolinyl group, a substituted or unsubstituted imidazopyridinyl group, a substituted or unsubstituted imidazopyrimidinyl group, a substituted or unsubstituted pyridinyl group, a substituted or unsubstituted pyrazinyl group, a substituted or unsubstituted pyrimidinyl group, a substituted or unsubstituted indolyl group, a substituted or unsubstituted purinyl group, a substituted or unsubstituted quinolinyl group, a substituted or unsubstituted phthalazinyl group, a substituted or unsubstituted indolizinyl group, a substituted or unsubstituted naphthyridinyl group, a substituted or unsubstituted quinazolinyl group, a substituted or unsubstituted cinnolinyl group, a substituted or unsubstituted indazolyl group, a substituted or unsubstituted carbazolyl group, a substituted or unsubstituted phenazinyl group, a substituted or unsubstituted phenanthridinyl group, a substituted or unsubstituted pyranyl group, substituted or unsubstituted chromenyl group, a substituted or unsubstituted benzofuranyl group, a substituted or unsubstituted thiophenyl group, a substituted or unsubstituted benzothiophenyl group, a substituted or unsubstituted isothiazolyl group, a substituted or unsubstituted benzoimidazolyl group, or a substituted or unsubstituted isoxazolyl group, but is not limited thereto.

In detail, each of $R_1$ through $R_8$ and $R_{20}$ through $R_{35}$ is independently one of hydrogen; heavy hydrogen (e.g. deuterium, tritium); a halogen atom; a hydroxyl group; a cyano group; a methyl group; an ethyl group; a propyl group; a butyl group; a pentyl group; an ethenyl group; a prophenyl group; a butenyl group; a pentenyl group; an acetyl group; a methoxy group; an ethoxy group; a propoxy group; a butoxy group; a pentoxy group; a phenyl group; a carbazolyl group; a fluorenyl group; a naphthyl group; an anthryl group; a pyridinyl group; a quinolinyl group; a benzoimidazolyl group; an imidazopyridinyl group; an imidazopyrimidinyl group; a phenyl group, a carbazolyl group, a fluorenyl group, a naphthyl group, an anthryl group, a pyridinyl group, a quinolinyl group, a benzoimidazolyl group, an imidazopyridinyl group, or an imidazopyrimidinyl group substituted with at least one of heavy hydrogen (e.g. deuterium, tritium), a halogen atom, a hydroxyl group, a cyano group, a $C_1$-$C_{10}$ alkyl group, a $C_1$-$C_{10}$ alkoxy group, a $C_6$-$C_{14}$ aryl group, and a $C_2$-$C_{14}$ heteroaryl group; and —$(X_2)_a$—$N(R_{40})(R_{41})$, but is not limited thereto. Here, examples of the $C_1$-$C_{10}$ alkyl group include a methyl group, an ethyl group, a propyl group, a butyl group, and a pentyl group, examples of the $C_1$-$C_{10}$ alkoxy group include a methoxy group, an ethoxy group, a propoxy group, a butoxy group, and a pentoxy group, examples of the $C_6$-$C_{14}$ aryl group include a phenyl group, a naphthyl group, and an anthryl group, examples of the $C_2$-$C_{14}$ heteroaryl group include a pyridinyl group, a pyrimidinyl group, and a carbazolyl group, but are not limited thereto. Each of $R_{40}$ and $R_{41}$ is independently one of a phenyl group; a carbazolyl group; a fluorenyl group; a naphthyl group; an anthryl group; a pyridinyl group; a quinolinyl group; a benzoimidazolyl group; an imidazopyridinyl group; an imidazopyrimidinyl group; and a phenyl group, a carbazolyl group, a fluorenyl group, a naphthyl group, an anthryl group, a pyridinyl group, a quinolinyl group, a benzoimidazolyl group, an imidazopyridinyl group, or an imidazopyrimidinyl group substituted with at least one of heavy hydrogen (e.g. deuterium, tritium), a halogen atom, a hydroxyl group, a cyano group, a $C_1$-$C_{10}$ alkyl group, a $C_1$-$C_{10}$ alkoxy group, a $C_6$-$C_{14}$ aryl group, and a $C_3$-$C_{14}$ heteroaryl group, but is not limited thereto. Examples of the $C_1$-$C_{10}$ alkyl group, the $C_1$-$C_{10}$ alkoxy group, the $C_6$-$C_{14}$ aryl group, and the $C_3$-$C_{14}$ heteroaryl group are as described above.

Each of $R_1$ through $R_8$ and $R_{20}$ through $R_{35}$ is independently one of hydrogen, heavy hydrogen (e.g. deuterium, tritium), a halogen atom, a hydroxyl group, a cyano group, Formulas 4A through 4G below, and —$(X_2)_a$—$N(R_{40})(R_{41})$, but is not limited thereto:

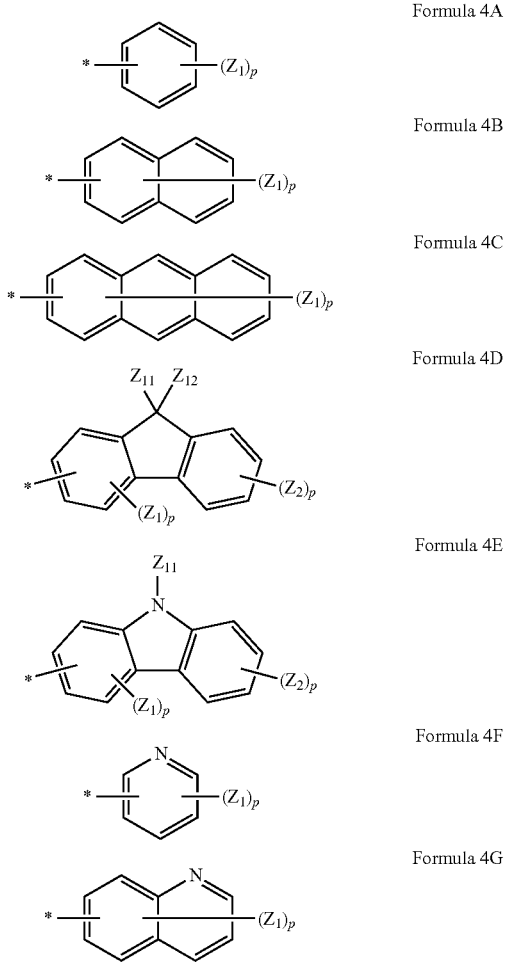

In Formulas 4A through 4G, each of $Z_1$, $Z_2$, $Z_{11}$, and $Z_{12}$ may be independently hydrogen, heavy hydrogen (e.g. deuterium, tritium), a halogen atom, a cyano group, a hydroxyl group, a carboxyl group, a nitro group, a $C_1$-$C_{10}$ alkyl group, a $C_1$-$C_{10}$ alkoxy group, a $C_6$-$C_{14}$ aryl group, or a $C_3$-$C_{14}$ heteroaryl group, and each of p and q is independently an integer from 1 to 8.

For example, each of $Z_1$, $Z_2$, $Z_{11}$, and $Z_{12}$ may be independently hydrogen, heavy hydrogen (e.g. deuterium, tritium), a halogen atom, a methyl group, an ethyl group, a propyl group, a butyl group, a methoxy group, an ethoxy group, a propoxy group, a phenyl group, a naphthyl group, an anthryl group, a pyridinyl group, a pyrimidinyl group, or a carbazolyl group.

In —$(X_2)_a$—$N(R_{40})(R_{41})$, each of $R_{40}$ and $R_{41}$ may be independently one of Formulas 4A through 4G, and $X_2$ and a may be as described later.

In Formulas 1 and 2, each of $X_1$ through $X_3$ may be independently a substituted or unsubstituted $C_5$-$C_{14}$ arylene group or a substituted or unsubstituted $C_3$-$C_{14}$ heteroarylene group, but is not limited thereto.

For example, each of $X_1$ through $X_3$ is independently a phenylene group, a $C_1$-$C_{10}$ alkylphenylene group, a di($C_1$-$C_{10}$ alkyl)phenylene group, a ($C_6$-$C_{14}$ aryl)phenylene group, a di($C_6$-$C_{14}$ aryl)phenylene group, a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl)carbazolylene group, a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, a di($C_6$-$C_{14}$ aryl) fluorenylene group, a naphthylene group, a $C_1$-$C_{10}$ alkylnaphthylene group, a di($C_1$-$C_{10}$ alkyl)naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)anthrylene group, a ($C_6$-$C_{14}$ aryl) anthrylene group, a di($C_6$-$C_{14}$ aryl)anthrylene group, a pyridinylene group, a $C_1$-$C_{10}$ alkylpyridinylene group, a di($C_1$-$C_{10}$ alkyl)pyridinylene group, a ($C_6$-$C_{14}$ aryl)pyridinylene group, a di($C_6$-$C_{14}$ aryl)pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl)quinolinylene group, a di($C_6$-$C_{14}$ aryl)quinolinylene group, a benzoimidazolylene group, a $C_1$-$C_{10}$ alkylbenzoimidazolylene group, a di($C_1$-$C_{10}$ alkyl)benzoimidazolylene group, a ($C_6$-$C_{14}$ aryl) benzoimidazolylene group, a di($C_6$-$C_{14}$ aryl)benzoimidazolylene group, an imidazopyridinylene group, a $C_1$-$C_{10}$ alkylimidazopyridinylene group, a di($C_1$-$C_{10}$ alkyl) imidazopyridinylene group, a ($C_6$-$C_{14}$ aryl) imidazopyridinylene group, a di($C_6$-$C_{14}$ aryl) imidazopyridinylene group, an imidazopyrimidinylene group, a $C_1$-$C_{10}$ alkylimidazopyrimidinylene group, a di($C_1$-$C_{10}$ alkyl) imidazopyrimidinylene group, a ($C_6$-$C_{14}$ aryl) imidazopyrimidinylene group, or a di($C_6$-$C_{14}$ aryl) imidazopyrimidinylene group, but is not limited thereto.

For example, $X_1$ may be a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, or a di($C_6$-$C_{14}$ aryl) fluorenylene group, and each of $X_2$ and $X_3$ may be independently a phenylene group, a $C_1$-$C_{10}$ alkylphenylene group, a di($C_1$-$C_{10}$ alkyl)phenylene group, a ($C_6$-$C_{14}$ aryl)phenylene group, or a di($C_6$-$C_{14}$ aryl)phenylene group, but is not limited thereto. Here, examples of the $C_1$-$C_{10}$ alkyl group include a methyl group, an ethyl group, a propyl group, and a butyl group, and examples of the $C_6$-$C_{14}$ aryl group include a phenyl group, a naphthyl group, and an anthryl group.

In Formula 1, each of $Ar_1$ and $Ar_2$ may be independently a substituted or unsubstituted $C_5$-$C_{14}$ aryl group or a substituted or unsubstituted $C_3$-$C_{14}$ heteroaryl group, but is not limited thereto.

In detail, each of $Ar_1$ and $Ar_2$ may be independently a substituted or unsubstituted phenyl group, a substituted or unsubstituted pentalenyl group, a substituted or unsubstituted indenyl group, a substituted or unsubstituted naphthyl group, a substituted or unsubstituted azulenyl, a substituted or unsubstituted heptalenyl, a substituted or unsubstituted indacenyl, a substituted or unsubstituted acenaphthyl group, a substituted or unsubstituted fluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenylenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted pyrazolyl group, a substituted or unsubstituted imidazolyl group, a substituted or unsubstituted imidazolinyl group, a substituted or unsubstituted imidazopyridinyl group, a substituted or unsubstituted imidazopyrimidinyl group, a substituted or unsubstituted pyridinyl group, a substituted or unsubstituted pyrazinyl group, a substituted or unsubstituted pyrimidinyl group, a substituted or unsubstituted indolyl group, a substituted or unsubstituted purinyl group, a substituted or unsubstituted quinolinyl group, a substituted or unsubstituted phthalazinyl group, a substituted or unsubstituted indolizinyl group, a substituted or unsubstituted naphthyridinyl group, a substituted or unsubstituted quinazolinyl group, a substituted or unsubstituted cinnolinyl group, a substituted or unsubstituted indazolyl group, a substituted or unsubstituted carbazolyl group, a substituted or unsubstituted phenazinyl group, a substituted or unsubstituted phenanthridinyl group, a substituted or unsubstituted pyranyl group, a substituted or unsubstituted chromenyl group, a substituted or unsubstituted benzofuranyl group, a substituted or unsubstituted thiophenyl group, a substituted or unsubstituted benzothiophenyl group, a substituted or unsubstituted isothiazolyl group, a substituted or unsubstituted benzoimidazolyl group, or a substituted or unsubstituted isoxazolyl group, but is not limited thereto.

In detail, each of $Ar_1$ and $Ar_2$ may be independently a phenyl group, a halogenated phenyl group, a $C_1$-$C_{10}$ alkylphenyl group, a di($C_1$-$C_{10}$ alkyl)phenyl group, a ($C_6$-$C_{14}$ aryl)phenyl group, a di($C_6$-$C_{14}$ aryl)phenyl group, a phenyl group substituted with a diarylamino group, a carbazolyl group, a halogenated carbazolyl group, a $C_1$-$C_{10}$ alkylcarbazolyl group, a di($C_1$-$C_{10}$ alkyl)carbazolyl group, a $C_6$-$C_{14}$ arylcarbazolyl group, a di($C_6$-$C_{14}$ aryl)carbazolyl group, a carbazolyl group substituted with a diarylamino group, a fluorenyl group, a halogenated fluorenyl group, a $C_1$-$C_{10}$ alkylfluorenyl group, a di($C_1$-$C_{10}$ alkyl)fluorenyl group, a ($C_6$-$C_{14}$ aryl)fluorenyl group, a di($C_6$-$C_{14}$ aryl)fluorenyl group, a fluorenyl group substituted with a diarylamino group, a naphthyl group, a halogenated naphthyl group, a $C_1$-$C_{10}$ alkylnaphthyl group, a di($C_1$-$C_{10}$ alkyl)naphthyl group, a ($C_6$-$C_{14}$ aryl)naphthyl group, a di($C_6$-$C_{14}$ aryl)naphthyl group, a naphthyl group substituted with a diarylamino group, an anthryl group, a halogenated anthryl group, a $C_1$-$C_{10}$ alkylanthryl group, a di($C_1$-$C_{10}$ alkyl)anthryl group, a ($C_6$-$C_{14}$ aryl)anthryl group, a di($C_6$-$C_{14}$ aryl)anthryl group, an anthryl group substituted with a diarylamino group, a pyridinyl group, a halogenated pyridinyl group, a $C_1$-$C_{10}$ alkylpyridinyl group, a di($C_1$-$C_{10}$ alkyl)pyridinyl group, a ($C_6$-$C_{14}$ aryl)pyridinyl group, a di($C_6$-$C_{14}$ aryl)pyridinyl group, a pyridinyl group substituted with a diarylamino group, a quinolinyl group, a halogenated quinolinyl group, a $C_1$-$C_{10}$ alkylquinolinyl group, a di($C_1$-$C_{10}$ alkyl)quinolinyl group, a ($C_6$-$C_{14}$ aryl)quinolinyl group, a di($C_6$-$C_{14}$ aryl) quinolinyl group, a quinolinyl group substituted with a diarylamino group, a benzoimidazolyl group, a halogenated benzoimidazolyl group, a $C_1$-$C_{10}$ alkylbenzoimidazolyl group, a di($C_1$-$C_{10}$ alkyl)benzoimidazolyl group, a ($C_6$-$C_{14}$ aryl)benzoimidazolyl group, a di($C_6$-$C_{14}$ aryl)benzoimidazolyl group, a benzoimidazolyl group substituted with a diarylamino group, an imidazopyridinyl group, a halogenated imidazopyridinyl group, a $C_1$-$C_{10}$ alkylimidazopyridinyl group, a di($C_1$-$C_{10}$ alkyl) imidazopyridinyl group, a ($C_6$-$C_{14}$ aryl) imidazopyridinyl group, a di($C_6$-$C_{14}$ aryl) imidazopyridinyl group, an imidazopyridinyl group substituted with a diarylamino group, an imidazopyrimidinyl group, a halogenated imidazopyrimidinyl group, a $C_1$-$C_{10}$ alkylimidazopyrimidinyl group, a di($C_1$-$C_{10}$ alkyl) imidazopyrimidinyl group, a ($C_6$-$C_{14}$ aryl) imidazopyrimidinyl group, a di($C_6$-$C_{14}$ aryl) imidazopyrimidinyl group, or an imidazopyrimidinyl group substituted with a diarylamino group. Here, examples of the $C_1$-$C_{10}$ alkyl group include a methyl group, an ethyl group, a propyl group, a butyl group, and a pentyl group, examples of the $C_6$-$C_{14}$ aryl group include a phenyl group, a naphthyl group, and an anthryl group, and examples of the "aryl group" in the "diarylamino group" include a phenyl group, a naphthyl group, and an anthryl group, but are not limited thereto.

In Formulas 1 and 2, each of a and b is independently an integer from 0 to 5. For example, each of a and b may be independently 0, 1, or 2, but is not limited thereto. When a is equal to or above 2, at least two $X_2$ may be identical to or different from each other, and when b is equal to or above 2, at least two $X_3$ may be identical to or different from each other.

Formula 1 above may be represented by Formula 1a or 1b below, but is not limited thereto:

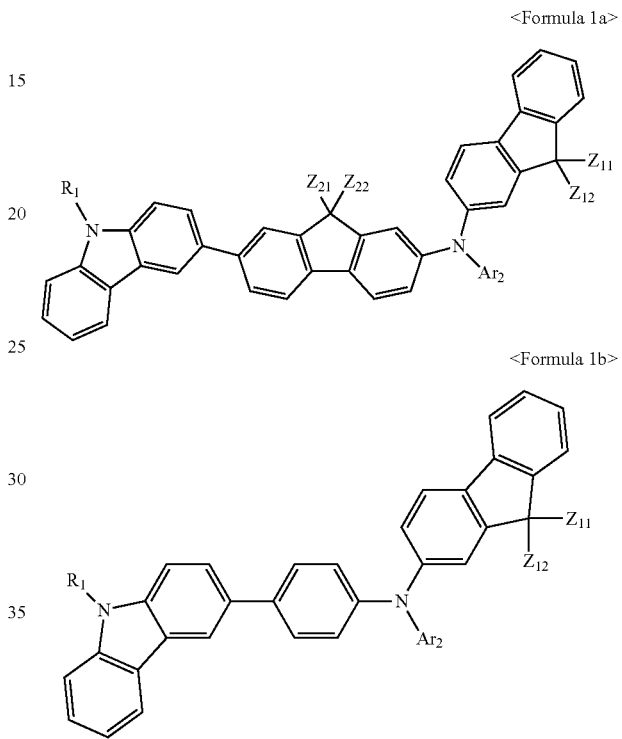

<Formula 1a>

<Formula 1b>

Here, details about $R_1$, $Z_{11}$, $Z_{12}$, and $Ar_2$ are identical to the above description. Also, details about $Z_{21}$ and $Z_{22}$ are identical to details about $Z_{11}$ above.

For example, in Formula 1a and 1b, $R_1$ may be one of a phenyl group; a carbazolyl group; a fluorenyl group; a naphthyl group; an anthryl group; a pyridinyl group; a quinolinyl group; a benzoimidazolyl group; an imidazopyridinyl group; an imidazopyrimidinyl group; and a phenyl group, a carbazolyl group, a fluorenyl group, a naphthyl group, an anthryl group, a pyridinyl group, a quinolinyl group, a benzoimidazolyl group, or an imidazopyridinyl group substituted with at least one of heavy hydrogen (e.g. deuterium, tritium), a halogen atom, a hydroxyl group, a cyano group, a $C_1$-$C_{10}$ alkyl group, a $C_1$-$C_{10}$ alkoxy group, a $C_6$-$C_{14}$ aryl group, and a $C_3$-$C_{14}$ heteroaryl group (details about the $C_1$-$C_{10}$ alkyl group, the $C_1$-$C_{10}$ alkoxy group, the $C_6$-$C_{14}$ aryl group, and the $C_3$-$C_{14}$ heteroaryl group are identical to the above descriptions); each of $Z_{11}$, $Z_{12}$, $Z_{21}$, and $Z_{22}$ may be independently hydrogen, heavy hydrogen (e.g. deuterium, tritium), a halogen atom, a methyl group, an ethyl group, a propyl group, a butyl group, a methoxy group, an ethoxy group, a propoxy group, a phenyl group, a naphthyl group, an anthryl group, a pyridinyl group, a pyrimidinyl group, or a carbazolyl group; and $Ar_2$ may be a phenyl group, a halogenated phenyl group, a $C_1$-$C_{10}$ alkylphenyl group, a di($C_1$-$C_{10}$ alkyl)phenyl group, a ($C_6$-$C_{14}$ aryl)phenyl group, a di($C_6$-$C_{14}$ aryl)phenyl group, a phenyl group substituted with a diarylamino group, a carbazolyl group, a halogenated carbazolyl group, a $C_1$-$C_{10}$ alkylcarbazolyl group, a di($C_1$-$C_{10}$ alkyl)carbazolyl group, a $C_6$-$C_{14}$ arylcarbazolyl group, a di($C_6$-$C_{14}$ aryl)carbazolyl group, a carbazolyl group substituted with a diarylamino group, a fluorenyl group, a halogenated fluorenyl group, a $C_1$-$C_{10}$ alkylfluorenyl group, a di($C_1$-$C_{10}$ alkyl)fluorenyl group, a ($C_6$-$C_{14}$ aryl)fluorenyl group, a di($C_6$-$C_{14}$ aryl)fluorenyl group, a fluorenyl group substituted with a diarylamino group, a naphthyl group, a halogenated naphthyl group, a $C_1$-$C_{10}$ alkylnaphthyl group, a di($C_1$-$C_{10}$ alkyl)naphthyl group, a ($C_6$-$C_{14}$ aryl)naphthyl group, a di($C_6$-$C_{14}$ aryl)naphthyl group, a naphthyl group substituted with a diarylamino group, an anthryl group, a halogenated anthryl group, a $C_1$-$C_{10}$ alkylanthryl group, a di($C_1$-$C_{10}$ alkyl)anthryl group, a ($C_6$-$C_{14}$ aryl)anthryl group, a di($C_6$-$C_{14}$ aryl)anthryl group, or an anthryl group substituted with a diarylamino group, wherein an aryl group of the diarylamino group may be a phenyl group, a naphthyl group, or an anthryl group.

The compound represented by Formula 1 above may be one of Compounds 1 to 18 below, but is not limited thereto:

<Compound 1>

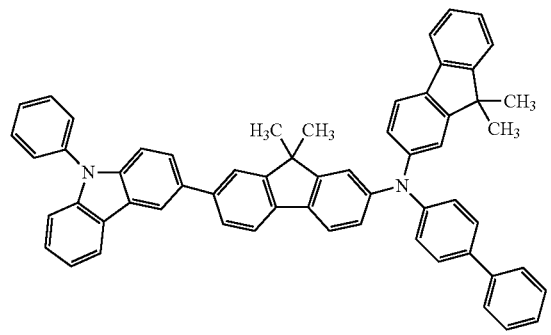

<Compound 2>

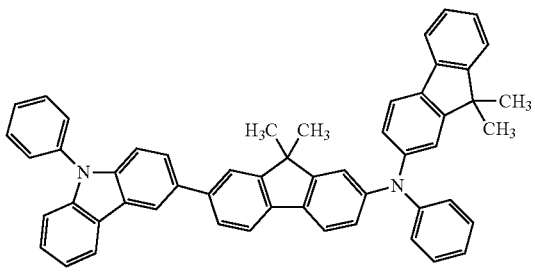

<Compound 3>

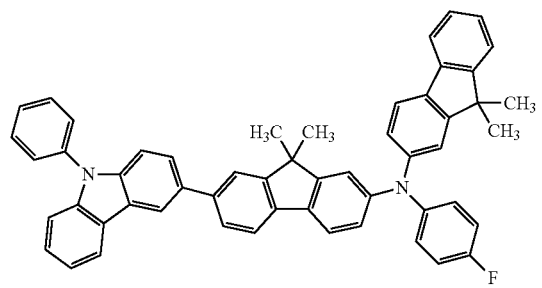

<Compound 4>

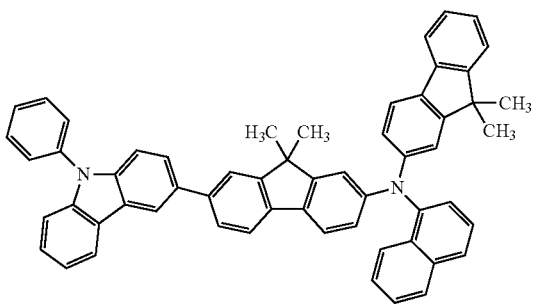

<Compound 5>

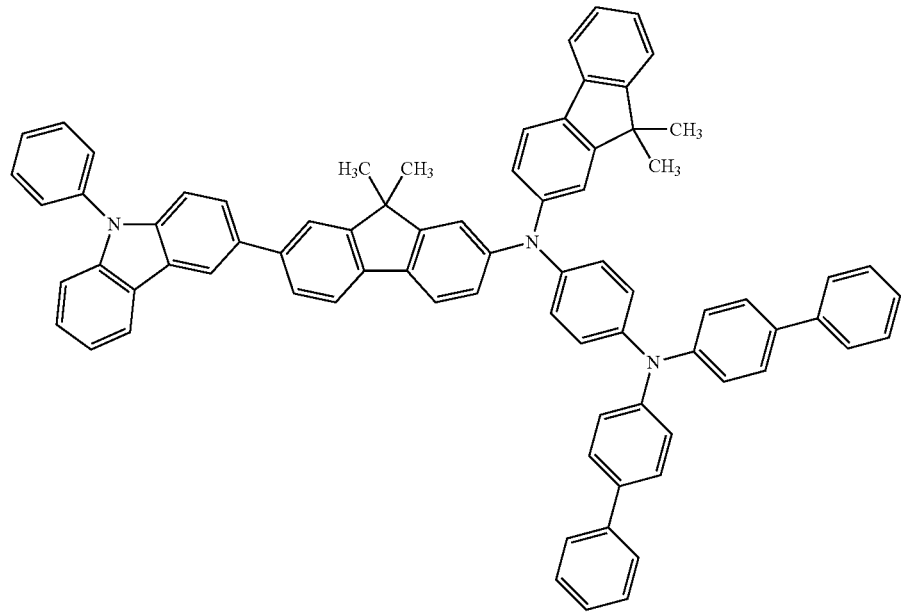

<Compound 6>
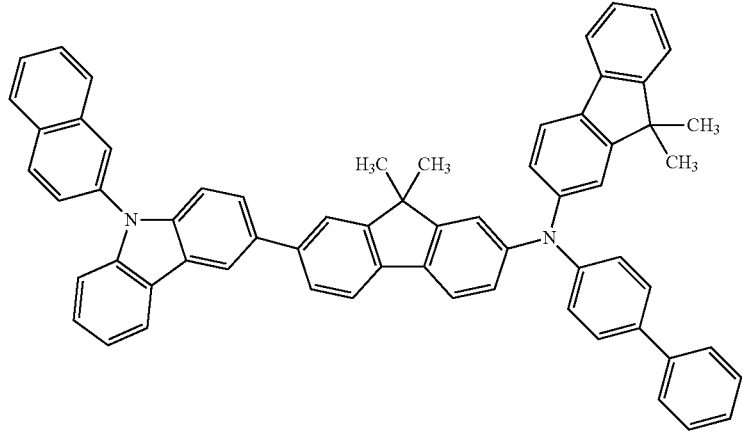
<Compound 7>
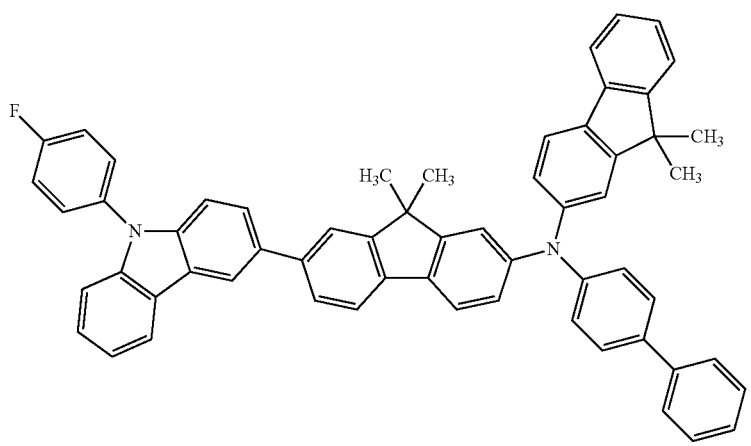
<Compound 8>
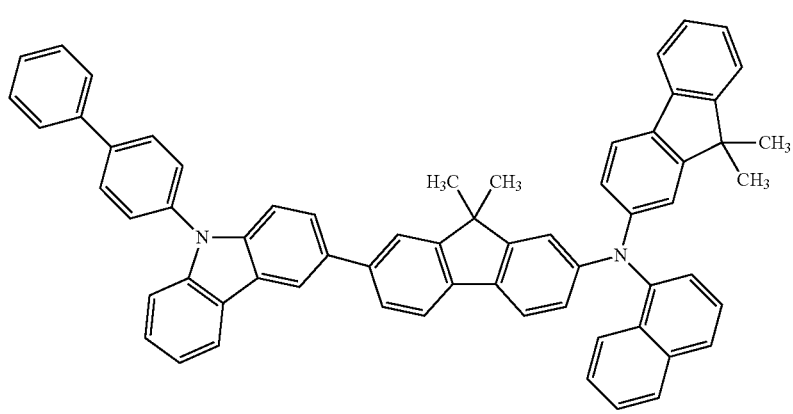

-continued
<Compound 9>
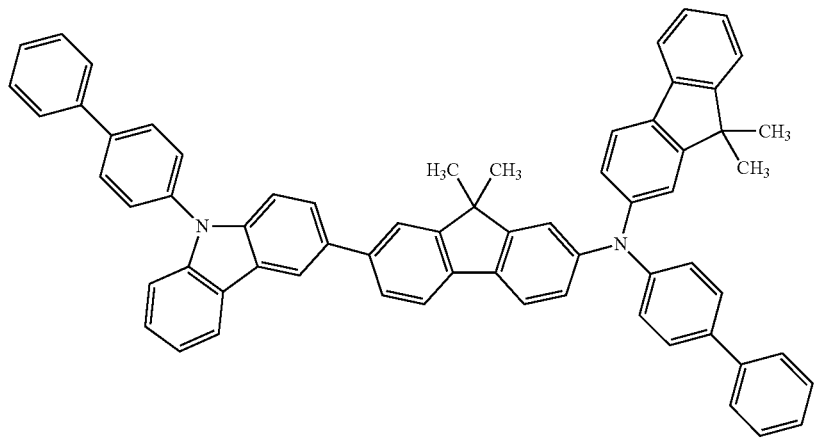
<Compound 10>
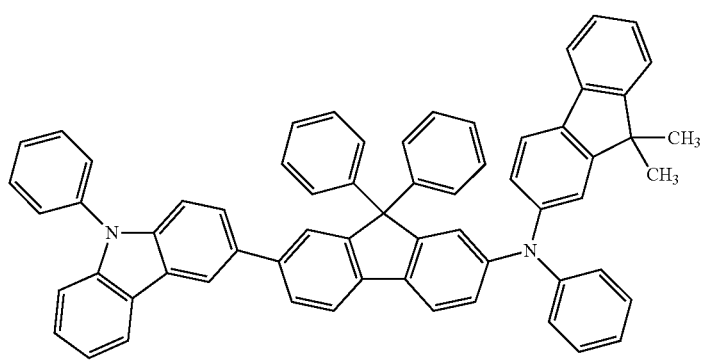
<Compound 11>
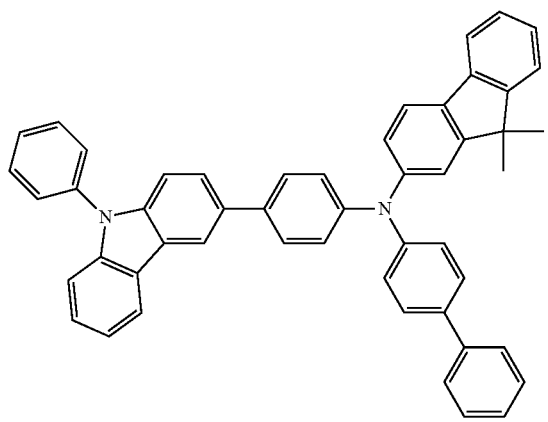
<Compound 12>
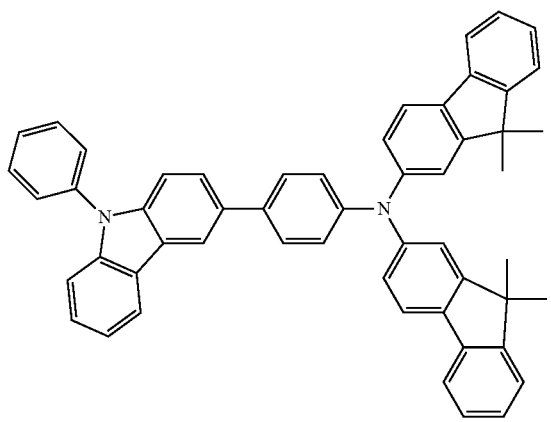
<Compound 13>
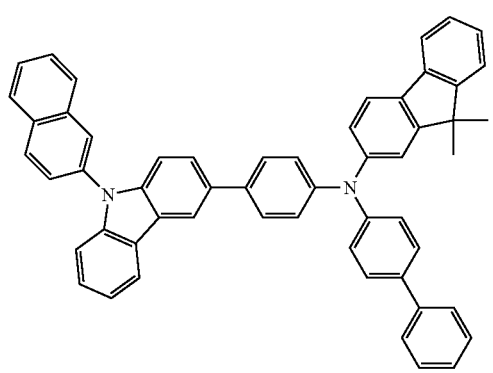
<Compound 14>
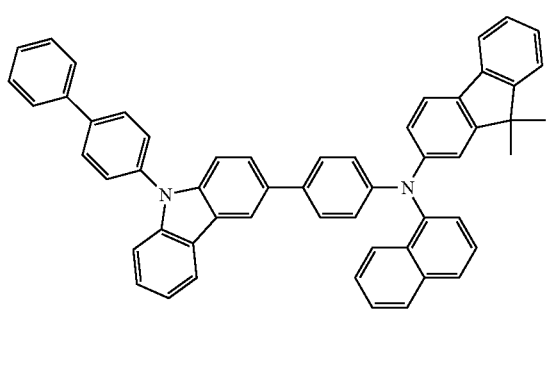

<Compound 15>
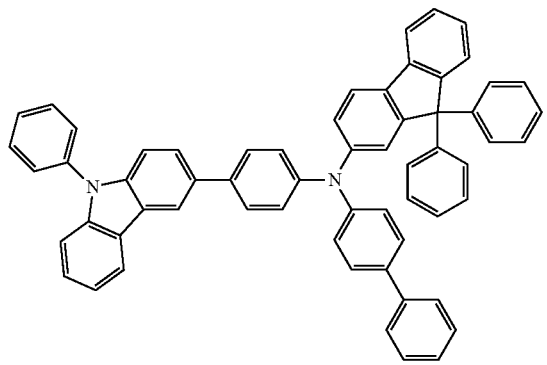

<Compound 16>
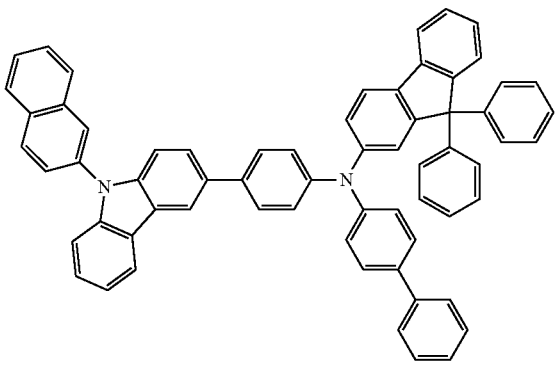

<Compound 17>
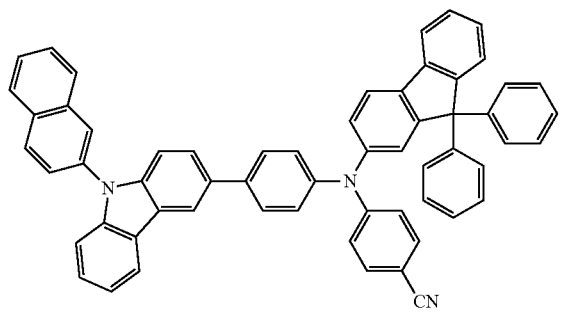

<Compound 18>
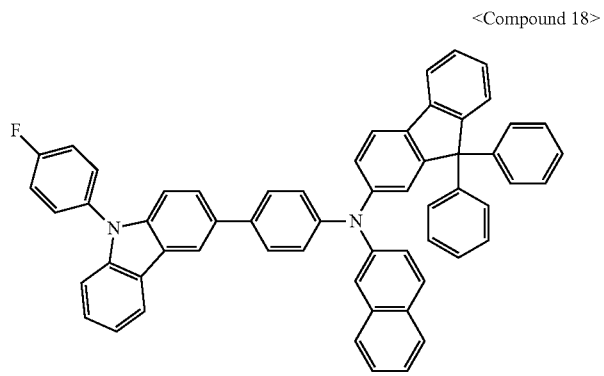

The compound represented by Formula 2 may be represented by Formula 2a below:

<Formula 2a>
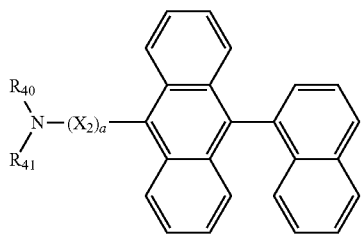

In Formula 2a, details about $R_{40}$, $R_{41}$, $X_2$, and a are as described above.

For example, in Formula 2a, each of $R_{40}$ and $R_{41}$ may be independently one of a phenyl group; a carbazolyl group; a fluorenyl group; a naphthyl group; an anthryl group; a pyridinyl group; a quinolinyl group; a benzoimidazolyl group; an imidazopyridinyl group; an imidazopyrimidinyl group; and a phenyl group, a carbazolyl group, a fluorenyl group, a naphthyl group, an anthryl group, a pyridinyl group, a quinolinyl group, a benzoimidazolyl group, or an imidazopyridinyl group substituted with at least one of heavy hydrogen (e.g. deuterium, tritium), a halogen atom, a hydroxyl group a cyano group, a $C_1$-$C_{10}$ alkyl group, a $C_1$-$C_{10}$ alkoxy group, a $C_6$-$C_{14}$ aryl group, and a $C_3$-$C_{14}$ heteroaryl group (for example, one of Formulas 4A through 4G, refer to the above description for details about the $C_1$-$C_{10}$ alkyl group, the $C_1$-$C_{10}$ alkoxy group, the $C_6$-$C_{14}$ aryl group, and the $C_3$-$C_{14}$ heteroaryl group); $X_2$ may be a phenylene group, a $C_1$-$C_{10}$ alkylphenylene group, a di($C_1$-$C_{10}$ alkyl)phenylene group, a ($C_6$-$C_{14}$ aryl)phenylene group, or a di($C_6$-$C_{14}$ aryl)phenylene group; and a may be 1 or 2, but are not limited thereto.

The compound represented by Formula 2 may be one of Compounds 19 through 28, but is not limited thereto.

<Compound 19>
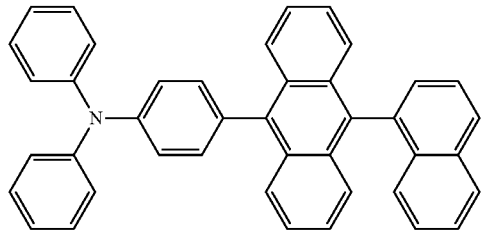

<Compound 20>
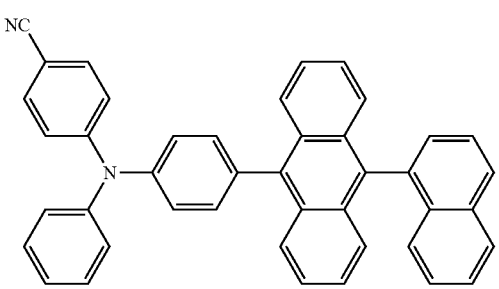

<Compound 21>

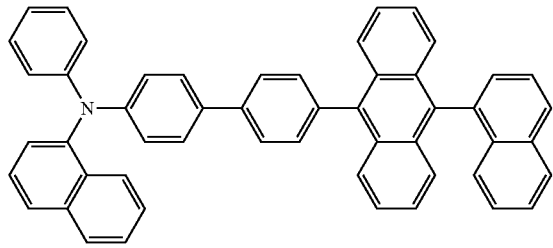

<Compound 22>

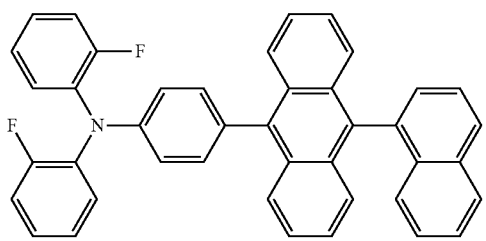

<Compound 23>

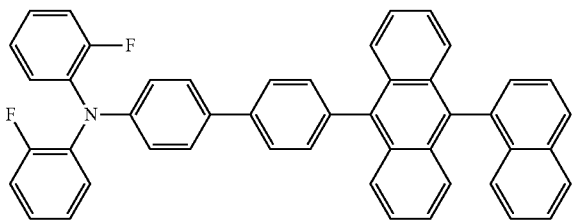

<Compound 24>

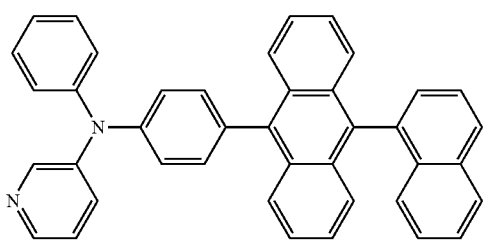

<Compound 25>

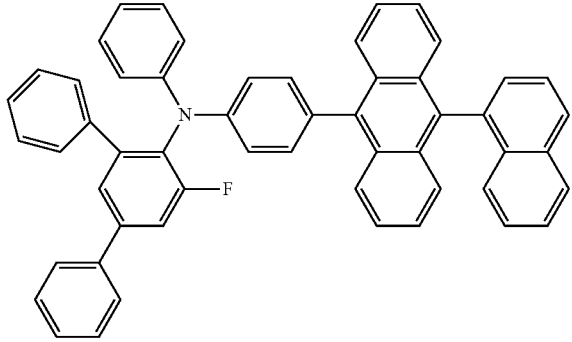

<Compound 26>

<Compound 27>

<Compound 28>

Herein, examples of the unsubstituted $C_1$-$C_{50}$ alkyl group (or $C_1$-$C_{50}$ alkyl group) include methyl, ethyl, propyl, isobutyl, sec-butyl, pentyl, iso-amyl, and hexyl. Also, the substituted $C_1$-$C_{50}$ alkyl group is obtained as at least one hydrogen atom in the unsubstituted $C_1$-$C_{50}$ alkyl group is substituted with a hydroxy group, a nitro group, a cyano group, an amino group, an amidino group, hydrazine, hydrazone, a carboxyl group or a salt thereof, a sulfonic acid group or a salt thereof, a phosphoric acid or a salt thereof, a $C_1$-$C_{30}$ alkyl group, a $C_2$-$C_{30}$ alkenyl group, a $C_2$-$C_{30}$ alkynyl group, a $C_6$-$C_{30}$ aryl group, a $C_2$-$C_{20}$ heteroaryl group, —N($Q_1$)($Q_2$), or —Si($Q_3$)($Q_4$)($Q_5$) (Here, each of $Q_1$ through $Q_5$ is independently selected from the group consisting of hydrogen, a $C_1$-$C_{30}$ alkyl group, a $C_2$-$C_{30}$ alkenyl group, a $C_2$-$C_{30}$ alkynyl group, a $C_6$-$C_{30}$ aryl group, and a $C_2$-$C_{20}$ heteroaryl group). The substituted or unsubstituted $C_1$-$C_{50}$ alkylene group has the same structure as the substituted or unsubstituted $C_1$-$C_{50}$ alkyl group described above, except that the substituted or unsubstituted $C_1$-$C_{50}$ alkylene group is a divalent linker.

Herein, the unsubstituted $C_1$-$C_{50}$ alkoxy group (or $C_1$-$C_{50}$ alkoxy group) is represented by a formula of —$OA_1$ (here, $A_1$ is the unsubstituted $C_1$-$C_{50}$ alkyl group described above), and examples thereof include methoxy, ethoxy, and isopropyloxy. Also, at least one hydrogen atom in the alkoxy group may be substituted with a substituent like the substituted $C_1$-$C_{50}$ alkyl group described above.

Herein, the unsubstituted $C_2$-$C_{50}$ alkenyl group (or $C_2$-$C_{50}$ alkenyl group) contains at least one carbon double bond in the middle or at the end, such as ethenyl, prophenyl, and butenyl. At least one hydrogen atom in the unsubstituted $C_2$-$C_{50}$ alkenyl group may be substituted with a substituent like the substituted $C_1$-$C_{50}$ alkyl group described above. The substituted or unsubstituted $C_2$-$C_{50}$ alkenylene group has the same structure as the substituted or unsubstituted $C_2$-$C_{50}$ alkenyl group described above, except that the substituted or unsubstituted $C_2$-$C_{50}$ alkenylene group is a divalent linker.

Herein, the unsubstituted $C_2$-$C_{50}$alkynyl group (or $C_2$-$C_{50}$alkynyl group) contains at least one triple bond in the middle or at the end of the $C_2$-$C_{50}$ alkyl group described above, such as ethynyl or propynyl. At least one hydrogen atom in the alkynyl group may be substituted with a substituent like the substituted $C_1$-$C_{50}$ alkyl group described above.

Herein, the unsubstituted $C_5$-$C_{50}$ aryl group denotes a monovalent group having a carbocyclic aromatic system of 5 to 30 carbon atoms including at least one aromatic ring, and the unsubstituted $C_5$-$C_{50}$ arylene group denotes a divalent group having a carbocyclic aromatic system of 5 to 30 carbon atoms including at least one aromatic ring. If the aryl group and the arylene group include at least two rings, these at least two rings may be fused to each other. At least one hydrogen atom of the aryl group and the arylene group may be substituted with a substituent like the substituted $C_1$-$C_{50}$ alkyl group described above.

Examples of the substituted or unsubstituted $C_5$-$C_{50}$ aryl group include a phenyl group, a $C_1$-$C_{10}$ alkylphenyl group (for example, an, ethylphenyl group), a $C_1$-$C_{10}$ alkylbiphenyl group (for example, an ethylbiphenyl group), a halophenyl group (for example, o-, m-, and p-fluorophenyl groups, and a dichlorophenyl group), a dicyanophenyl group, a trifluoromethoxyphenyl group, o-, m-, and p-tolyl groups, o-, m-, and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, an azulenyl group, a heptalenyl group, an acenaphthylenyl group a phenalenyl group, a fluorenyl group, an antraquinolyl group, a methylanthryl group, a penanthryl group, a triphenylenyl group, a pyrenyl group, a chrysenyl group, an ethylchrysenyl group, a picenyl group, a perylenyl group, a chloroperylenyl group, a pentacenyl group, a pentaphenyl group, a tetraphenylenyl group, a hexaphenyl group, a hexacenyl group, a rubicenyl group, acoronenyl group, a trinaphthylenyl group, a heptaphenyl group, a heptacenyl group, a pyranthrenyl group, and an ovalenyl group. Also, examples of the substituted $C_5$-$C_{50}$aryl group may be easily recognized by referring to the examples of the unsubstituted $C_5$-$C_{50}$ aryl group described above and the substituents of the substituted $C_1$-$C_{50}$alkyl group. Examples of the substituted or unsubstituted $C_5$-$C_{50}$ arylene group may be easily recognized by referring to the examples of the substituted or unsubstituted $C_5$-$C_{50}$ aryl group.

Herein, the unsubstituted $C_2$-$C_{50}$heteroaryl group denotes a monovalent group having a system consisting at least one aromatic ring including at least one heteroatom selected from among N, O, P, and S, wherein the rest of ring atoms are C, and the unsubstituted $C_2$-$C_{50}$ heteroarylene group denotes a divalent group having a system consisting at least one aromatic ring including at least one heteroatom selected from among N, O, P, and S, wherein the rest of ring atoms are C. Here, if the heteroaryl group and the heteroarylene group include at least two rings, the at least two rings may be fused to each other. At least one hydrogen atom in the heteroaryl group and the heteroarylene group may be substituted with a substituent like the $C_1$-$C_{50}$ alkyl group described above.

Examples of the unsubstituted $C_2$-$C_{50}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the unsubstituted $C_2$-$C_{50}$ heteroarylene group may be easily recognized by referring to the examples of the substituted or unsubstituted $C_2$-$C_{50}$ arylene group.

The unsubstituted $C_5$-$C_{50}$ aryloxy group may include a formula of —OA$_2$ (Here, A$_2$ is the unsubstituted $C_5$-$C_{50}$ aryl group described above), and the unsubstituted $C_5$-$C_{50}$ arylthio group may include a formula of —OA$_3$ (Here, A$_3$ is the unsubstituted $C_5$-$C_{50}$ aryl group described above). At least one hydrogen atom of the aryloxy group and the arylthio group may be substituted by a substituent like the $C_1$-$C_{30}$ alkyl group described above.

The hole transporting third emission layer 110 may further include a fluorescent dopant or phosphorescent dopant emitting the third color light, aside from the compound represented by Formula 1 or 2 above. Since the third color light is a blue light, the hole transporting third emission layer 110 may further include a blue dopant.

Examples of the blue dopant include F$_2$Irpic, (F$_2$ppy)$_2$Ir (tmd), Ir(dfppz)$_3$, ter-fluorene, 4,4'-bis(4-diphenylaminostyryl) biphenyl (DPAVBi), 2,5,8,11-tetra-tert-butyl perylene (TBPe), and DPVBi, but is not limited thereto.

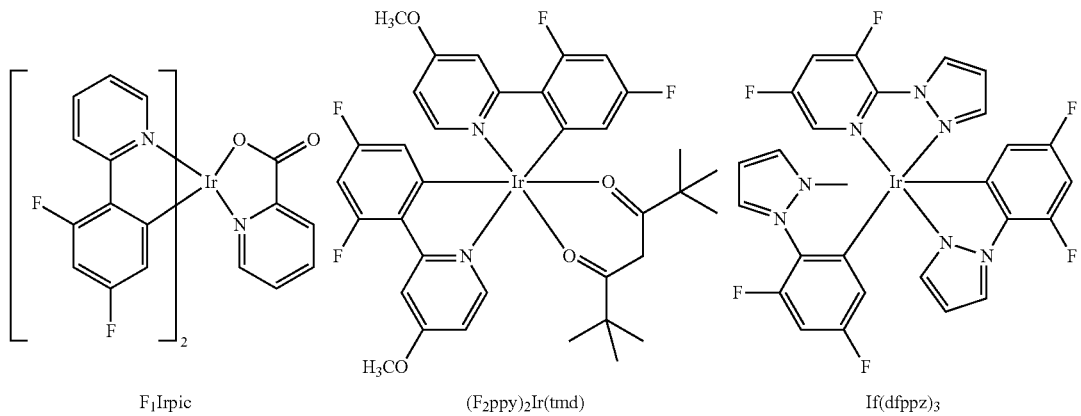

F$_1$Irpic  (F$_2$ppy)$_2$Ir(tmd)  If(dfppz)$_3$

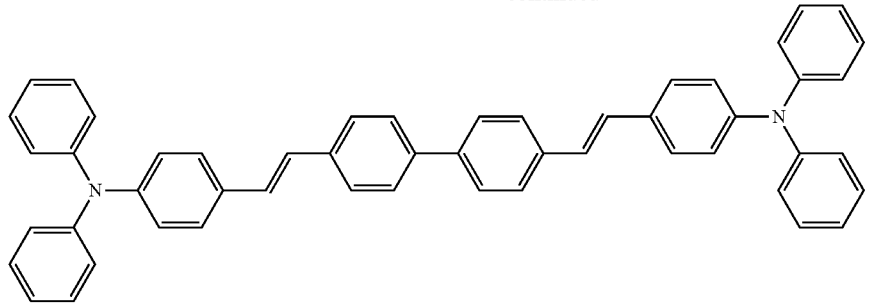

DPAVBi

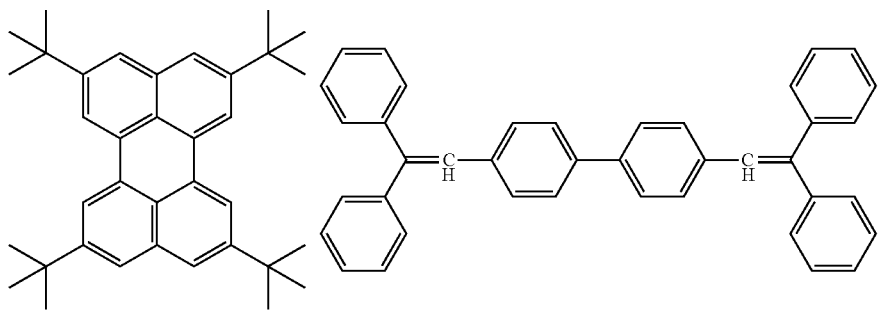

TBPe

DPVBi

A thickness of the hole transporting third emission layer 110 may be from 100 Å to 500 Å, for example, from 150 Å to 300 Å. If the thickness of the hole transporting third emission layer 110 is within the above range, the organic light emitting diode 100 substantially having no increase of a driving voltage may be realized.

Then, the first auxiliary layer 114 accelerating resonance of the first color light is disposed on the hole transporting third emission layer 110 of the first sub-pixel, and the first emission layer 113-1 is disposed on the first auxiliary layer 114. The second emission layer 113-2 is disposed on the hole transporting third emission layer 110 of the second sub-pixel. If the first color light is a red light, the first emission layer 113-1 may be a red emitting layer and if the second color light is a green light, the second emission layer 113-2 may be a green emitting light.

The first auxiliary layer 114 is a layer disposed between the hole transporting third emission layer 110 and the first emission layer 113-1 so as to adjust distances $L_1$ and $D_1$ described later, and may include a well known hole injection material, a well known hole transport material, or a well known material having both a hole injection function and a hole transport function.

Examples of the first auxiliary layer 114 include carbazole derivatives, such as N-phenylcarbazole and polyvinylcarbazole, N,N'-bis(3-methylphenyl)-N,N'-diphenyl-[1,1-b]phenyl]-4,4'-diamine (TPD), 4,4',4"-tris(N-carbazolyl)triphenylamine) (TCTA), and N,N'-di(1-naphthyl)-N,N'-diphenylbenzidine (NPB), but are not limited thereto.

A thickness of the first auxiliary layer 114 may be selected in a range satisfying the distances $D_1$ and $L_1$, which will be described later.

The first and second emission layers 113-1 and 113-2 may include a well known light emitting material. For example, the first and second emission layers 113-1 and 113-2 may include a well known host and dopant.

Examples of the well known host include $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, and distyrylarylene (DSA), but are not limited thereto.

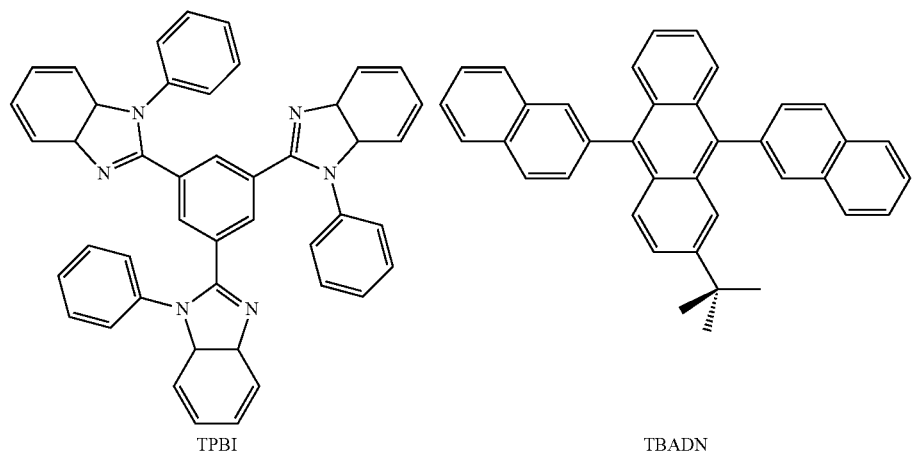

TPBI

TBADN

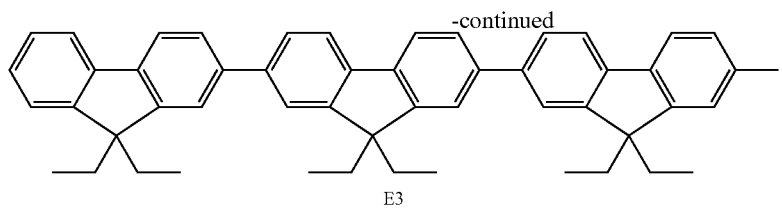

E3

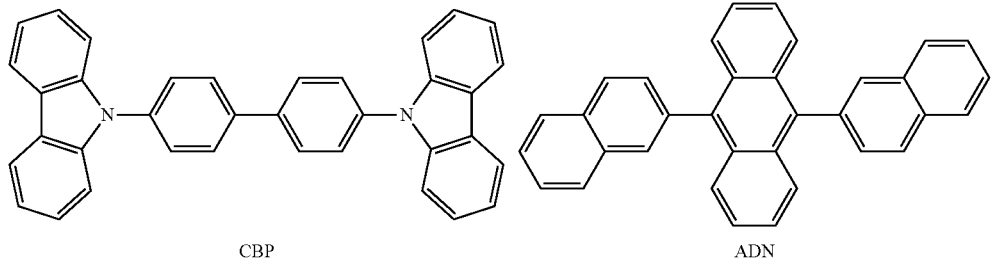

CBP

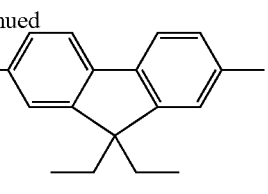

ADN

The dopant may be at least one of a fluorescent dopant and a phosphorescent dopant. The phosphorescent dopant may be an organic metal complex including iridium (Ir), platinum (Pt), osmium (Os), rhenium (Re), titanium (Ti), zirconium (Zr), hafnium (Hf), or a combination thereof, but is not limited thereto.

If the first color light is red, PtOEP, Ir(piq)$_3$, or BtpIr may be used as a well known red dopant, but the well known red dopant is not limited thereto.

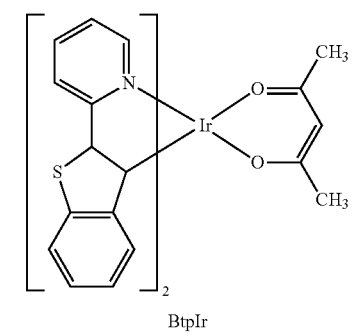

BtpIr

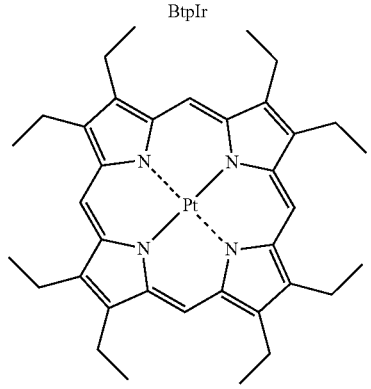

PtOEP

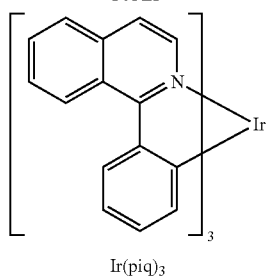

Ir(piq)$_3$

If the second color light is green, Ir(ppy)$_3$ (ppy=phenylpyridine), Ir(ppy)$_2$(acac), or Ir(mpyp)$_3$ may be used as a well known green dopant, but the well known green dopant is not limited thereto.

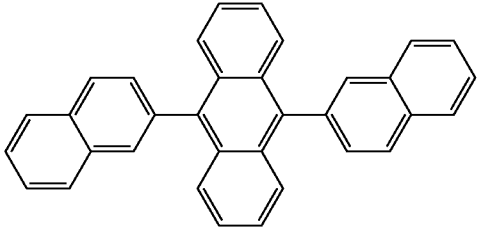

Ir(ppy)$_3$

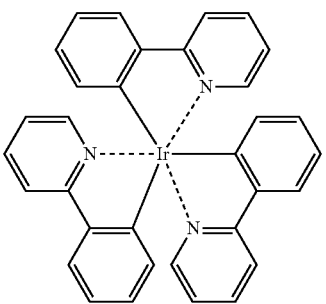

Ir(ppy)$_2$(acac)          Ir(mpyp)$_3$

If at least one of the first emission layer 113-1 and the second emission layer 113-2 includes a host and dopant, an amount of the dopant may be generally in the range from about 0.01 to about 15 parts by weight based on about 100 parts by weight of the host, but is not limited thereto.

Each of thicknesses of the first and second emission layers 113-1 and 113-2 may be independently from about 100 Å to about 1000 Å, for example, from about 200 Å to about 600 Å. When the thicknesses of the first and second emission layers 113-1 and 113-2 are within the above range, the organic light emitting diode 100 showing improved light emitting characteristics without substantial increase of a driving voltage may be manufactured.

When the first and second emission layers 113-1 and 113-2 include a phosphorescent dopant and are used together, a hole blocking layer (HBL, not shown in FIG. 1) may be formed by using a method, such as a vacuum deposition method, a spin coating method, a cast method, or an LB method, before forming the ETL 115, so as to prevent triple excitons or holes from diffusing into the ETL 115. When the HBL is formed by using a vacuum deposition method of a spin coating method, conditions of forming the HBL may differ based on a used compound, but may be similar to those of forming the HIL 107. A well known hole blocking material may be used for the HBL, such as an oxadiazole derivative, a triazole derivative, a phenanthroline derivative, or Balq.

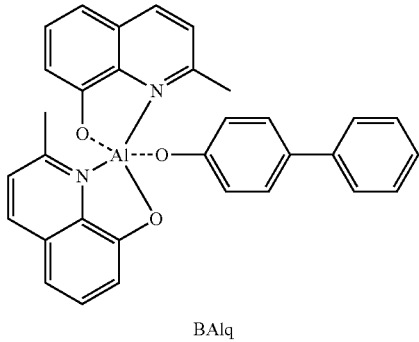

BAlq

A thickness of the HBL may be from about 10 Å to about 1000 Å, for example, from about 30 Å to about 300 Å. If the thickness of the HBL is within the above range, a good hole blocking characteristic may be obtained without substantial increase of a driving voltage.

Then, the ETL 115 is formed throughout the first through third sub-pixels by using any method, such as a vacuum deposition method, a spin coating method, or a cast method. When the ETL 115 is formed by using a vacuum deposition method or a spin coating method, conditions of forming the ELT 115 may differ according to a used compound, but may be generally selected from the similar conditions of forming the HIL 107. A well known hole transport material may be used for the ETL 115 so as to stably transport electrons injected from the second electrode 119. Examples of the well known hole transport material include quinoline derivatives, specifically tris(8-quinolinolate)aluminum (Alq3), TAZ, Balq, and beryllium bis(benzoquinolin-10-olate ($Bebq_2$), but are not limited thereto.

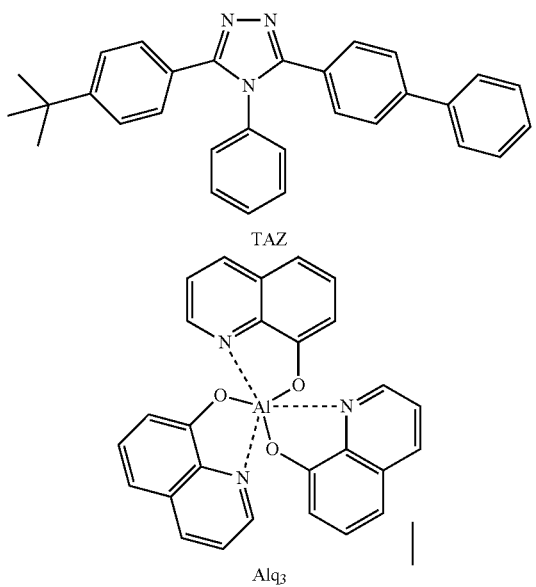

A thickness of the ETL 115 may be from about 100 Å to about 1000 Å, for example, from about 150 Å to about 500 Å. When the thickness of the ETL 115 is within the above range, a satisfactory electron transport characteristic may be obtained without substantial increase of a driving voltage.

Also, the ETL 115 may include an electron transport organic compound and a metal-containing material. Examples of the electron transport organic compound unlimitedly include 9,10-di(naphthalene-2-yl)anthracene (AND); and anthracene-based compounds, such as Compound 101 and 102 below, but are not limited thereto.

<Compound 101>

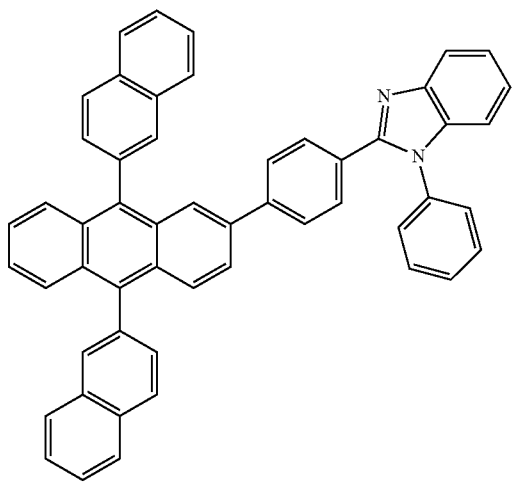

<Compound 102>

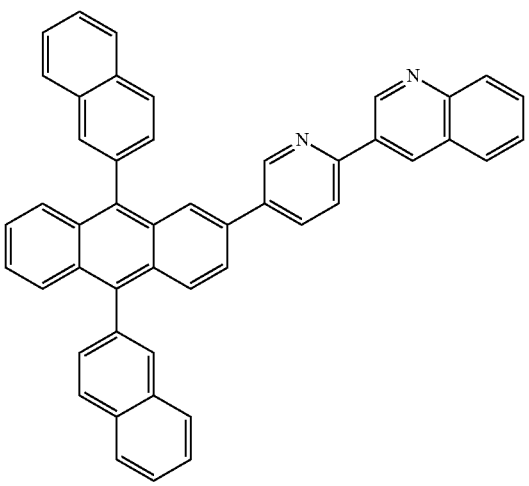

The metal-containing material may include an Li complex. Examples of the Li complex unlimitedly include lithium quinolate (LiQ) and Compound 103 below:

<Compound 103>

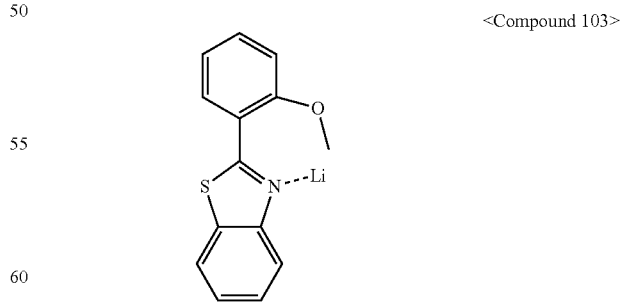

Also, the EIL 117 having a function of easily injecting electrons from the second electrode 119 may be disposed on the ETL 115, and a material of the EIL 117 is not specifically limited.

A well known EIL forming material, such as LiF, NaCl, CsF, $Li_2O$, or BaO, may be used for the EIL 117. Deposition conditions of the EIL 117 may differ according to a used compound, but may be generally selected from the same conditions as forming of the HIL 107.

A thickness of the EIL 117 may be from about 1 Å to about 100 Å, for example, from about 3 Å to about 90 Å. If the thickness of the EIL 117 is within the above range, a satisfactory electron injection characteristic may be obtained without substantial increase of a driving voltage.

The second electrode 119 is formed on the EIL 117 as a common layer. The second electrode 119 is a translucent electrode. The second electrode 119 may be a cathode constituting an EIL. Here, examples of a metal for forming the second electrode 119 include a metal having a low work function, an alloy, an electric conductive compound, and a mixture thereof. In detail, a translucent electrode may be obtained by forming thin film in a thickness from 10 Å to 500 Å by using lithium (Li), magnesium (Mg), aluminum (Al), aluminum-lithium (Al—Li), calcium (Ca), magnesium-indium (Mg—In), or magnesium-silver (Mg—Ag). Alternatively, the second electrode 119 may be a transparent electrode formed by using ITO or IZO, so as to manufacture a top emission device.

The organic light emitting diode 100 has a structure in which the first through third color lights generate a resonance between the first electrode 103 constituting a reflective electrode and the second electrode 119 constituting a translucent electrode, while being driven.

$$\frac{\lambda_1}{2n_1} \cdot m_1 - \frac{\lambda_1}{10} \le L_1 \le \frac{\lambda_1}{2n_1} \cdot m_1 + \frac{\lambda_1}{10} \qquad <\text{Equation 1}>$$

$$\frac{\lambda_2}{2n_2} \cdot m_2 - \frac{\lambda_2}{10} \le L_2 \le \frac{\lambda_2}{2n_2} \cdot m_2 + \frac{\lambda_2}{10} \qquad <\text{Equation 2}>$$

$$\frac{\lambda_3}{2n_3} \cdot m_3 - \frac{\lambda_3}{10} \le L_3 \le \frac{\lambda_3}{2n_3} \cdot m_3 + \frac{\lambda_3}{10} \qquad <\text{Equation 3}>$$

In Equations 1 through 3, $L_1$ denotes a distance between the first electrode 103 and the second electrode 119 in the first sub-pixel; $L_2$ denotes a distance between the first electrode 103 ad the second electrode 119 in the second sub-pixel; $L_3$ is a distance between the first electrode 103 and the second electrode 119 in the third sub-pixel; $\lambda_1$, $\lambda_2$, and $\lambda_3$ respectively denote wavelengths of the first through third color lights; $n_1$ denotes a refractive index of layers disposed between the first electrode 103 and the second electrode 119 in the first sub-pixel; $n_2$ denotes a refractive index of layers disposed between the first electrode 103 and the second electrode 119 in the second sub-pixel; $n_3$ denotes a refractive index of layers disposed between the first electrode 103 and the second electrode 119 in the third sub-pixel; and each of $m_1$, $m_2$, and $m_3$ is independently a natural number.

When the organic light emitting diode 100 satisfies Equations 1 through 3 above, the first through third color lights may be emitted to the outside of the organic light emitting diode 100 by passing through the second electrode 119 according to the principle of constructive interference while resonating between the first and second electrodes 103 and 119, and thus efficiency of the organic light emitting diode 100 may be improved.

In Equations 1 through 3, each of $m_1$, $m_2$, and $m_3$ may be 1.

When each of $m_1$, $m_2$, and $m_3$ is 1 in Equations 1 through 3 and the first color light is red light, a distance $D_1$ between the first electrode 103 and the first emission layer 113-1 in the first sub-pixel, e.g., a sum of the thicknesses of the HIL 107, hole transporting third emission layer 110, and first auxiliary layer 114, may be from 400 Å to 1000 Å, for example from 500 Å to 900 Å.

When each of $m_1$, $m_2$, and $m_3$ is 1 in Equations 1 through 3 and the second color light is green light, a distance $D_2$ between the first electrode 103 and the second emission layer 113-2 in the second sub-pixel, e.g., a sum of the thicknesses of the HIL 107 and hole transporting third emission layer 110, may be from 300 Å to 900 Å, for example from 400 Å to 800 Å.

When each of $m_1$, $m_2$, and $m_3$ is 1 in Equations 1 through 3 and the third color light is blue light, a sum $D_3$ of a distance between the first electrode 103 and the hole transporting third emission layer 110 and the thickness of the hole transporting third emission layer 110 may be from 200 Å to 800 Å, for example from 300 Å to 700 Å.

Alternatively, each of $m_1$, $m_2$, and $m_3$ may be 2 in Equations 1 through 3.

When each of $m_1$, $m_2$, and $m_3$ is 2 in Equations 1 through 3 and the first color light is red light, the distance $D_1$ between the first electrode 103 and the first emission layer 113-1 in the first sub-pixel, e.g., the sum of the thicknesses of the HIL 107, hole transporting third emission layer 110, and first auxiliary layer 114, may be from 1600 Å to 2300 Å, for example from 1700 Å to 2100 Å.

When each of $m_1$, $m_2$, and $m_3$ is 2 in Equations 1 through 3 and the second color light is green light, the distance $D_2$ between the first electrode 103 and the second emission layer 113-2 in the second sub-pixel, e.g., the sum of the thicknesses of the HIL 107 and hole transporting third emission layer 110, may be from 1300 Å to 2000 Å, for example from 1400 Å to 1900 Å.

When each of $m_1$, $m_2$, and $m_3$ is 2 in Equations 1 through 3 and the third color light is blue light, the sum $D_3$ of a distance between the first electrode 103 and the hole transporting third emission layer 110 and the thickness of the hole transporting third emission layer 110 may be from 900 Å to 1800 Å, for example from 1000 Å to 1600 Å.

When the distances $D_1$, $D_2$, and $D_3$ are within the above range, an optimum constructive interference may occur during resonance of each color. Also, since a light is emitted in the first and second emission layers 113-1 and 113-2 in the first and second sub-pixels, instead of the hole transporting third emission layer 110, color mixing due to third color emission in the first and second sub-pixels may be prevented. Moreover, in the organic light emitting diode 100, light is emitted as excitons are radiated, and such exciton radiation may be considered as electric dipole radiation. A weak microcavity phenomenon is a phenomenon where a damping rate of a dipole changes due to an image dipole induced by a reflector when dipole radiation is located at a distance below or equal to a wavelength of light to be emitted to the reflector, thereby changing strength of radiation. When the distances $D_1$ and $D_2$, and the sum $D_3$ are within the above range, light emitting efficiencies of the first through third color lights may be improved according to the weak microcavity phenomenon.

As shown in FIG. 1, $D_1 > D_2 = D_3$. In other words, $D_1 > D_2$ by disposing the first auxiliary layer 114 between the hole transporting third emission layer 110 and the first emission layer 113-1, e.g., a red emission layer.

Since the third color light is emitted by the hole transporting third emission layer 110 being a common layer in the organic light emitting diode of FIG. 1, an emission layer for emitting the third color light may not be separately patterned in a region of the third sub-pixel. Accordingly, an emission layer for emitting the third color light may not be misaligned.

Further, such an organic light emitting diode 100 has simple manufacturing processes and low manufacturing costs.

Figure 2:
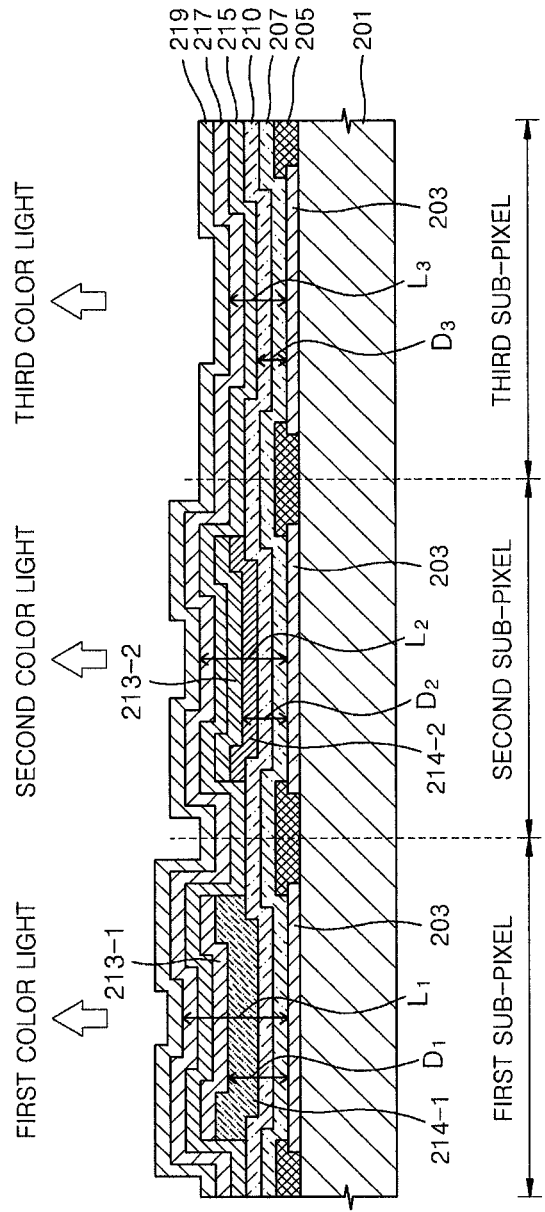
FIG. 2 is a cross-sectional view schematically illustrating an organic light emitting diode according to another embodiment.

FIG. 2 is a cross-sectional view schematically illustrating an organic light emitting diode 200 according to another embodiment.

A substrate 201 of the organic light emitting diode 200 includes a first sub-pixel, a second sub-pixel, and a third sub-pixel. A first electrode 203 is patterned according to the first through third sub-pixels. A HIL 207 and a hole transporting third emission layer 210 are disposed on the first electrode 203 as a common layer. A first auxiliary layer 214-1 and a first emission layer 213-1 for emitting a first color light are sequentially disposed on the hole transporting third emission layer 210 in the first sub-pixel, and a second auxiliary layer 214-2 and a second emission layer 213-2 for emitting a second color light are sequentially disposed on the hole transporting third emission layer 110 in the second sub-pixel. An ETL 215, an EIL 217, and a second electrode 219 are sequentially disposed thereon as a common layer.

Refer to descriptions about FIG. 1 for details about the substrate 201, the first electrode 203, the HIL 207, the hole transporting third emission layer 210, the first auxiliary layer 214-1, the first emission layer 213-1, the second emission layer 213-2, the ETL 215, the EIL 217, the second electrode 219, and distances $L_1$, $L_2$, $L_3$, $D_1$, $D_2$, and $D_3$ of the organic light emitting diode 200.

The second auxiliary layer 214-2 of the organic light emitting diode 200 increases resonance of the second color light. Refer to a material of the first auxiliary layer 214-1 for a material of the second auxiliary layer 214-2. The materials of the second auxiliary layer 214-2 and first auxiliary layer 214-1 may be identical to or different from each other. A thickness of the second auxiliary layer 214-2 may be selected within a range that satisfies the distances $L_2$ and $D_2$ described above.

In the organic light emitting diode 200, the distances $D_1$, $D_2$, and $D_3$ may have a relationship of $D_1>D_2>D_3$. For example, $D_1>D_2>D_3$ according to the first and second auxiliary layers 214-1 and 214-2 in the organic light emitting diode 200.

The organic light emitting diodes 100 and 200 have been described above with reference to FIGS. 1 and 2, but an organic light emitting diode of the present embodiments is not limited thereto. For example, the first electrode 103 or 203 may be a translucent electrode and the second electrode 119 or 219 may be a reflective electrode. Also, a functional layer having both a hole injection function and a hole transport function may be used instead of the HIL 107 or 207.

The organic light emitting diode may be included in a flat panel display device including a thin film transistor. The thin film transistor may include a gate electrode, source and drain electrodes, a gate insulation layer, and an active layer, wherein one of the source and drain electrodes is electrically connected to a first electrode of the organic light emitting diode.

The present embodiments will be described in greater detail with reference to the following examples. The following examples are for illustrative purposes only and are not intended to limit the scope of the embodiments.

EXAMPLES

Example 1

A first electrode (reflective electrode) was obtained by cutting an Al and ITO substrate (manufactured by SDI) having a thickness of 1300 Å to a size of 50 mm×50 mm×0.7 mm, washing the result product with ultrasonic waves in isopropyl alcohol and pure water respectively for 5 minutes, and then washing the result product with ultraviolet rays and ozone for 30 minutes. A HIL having a thickness of 200 Å was formed by depositing 2-TNATA on the first electrode, a hole transporting blue emission layer having a thickness of 200 Å was formed by co-depositing Compound 1 and DPAVB1 at a weight ratio of 98:2 on the HIL, and then a HBL having a thickness of 50 Å was formed by depositing Balq on the hole transporting blue emission layer. An ETL having a thickness of 200 Å was formed by depositing $Alq_3$ on the HBL, and then an EIL having a thickness of 5 Å was formed by depositing LiF. Then, an organic light emitting diode (blue light emission) was manufactured by forming a second electrode (translucent electrode) having a thickness of 180 Å by depositing Mg:Ag on the EIL.

The organic light emitting diode showed current density of 26.0 mA/cm$^2$, and high luminance of 1029 cd/m$^2$ at a driving voltage of 4.1 V, and color coordinate was (0.113, 0.120) and emission efficiency was 3.96 cd/A.

Example 2

An organic light emitting diode (green light emission) was manufactured in the same manner as in Example 1, except that a green emission layer having a thickness of 200 Å was formed by co-depositing CBP and Ir(ppy)$_3$ on the hole transporting blue emission layer at a weight ratio of 90:10, and then the HBL was formed.

The organic light emitting diode showed current density of 9.8 mA/cm$^2$, and high luminance of 2530 cd/m$^2$ at a driving voltage of 4.5 V, and color coordinate was (0.244, 0.68) and emission efficiency was 26.8 cd/A.

Example 3

An organic light emitting diode (red light emission) was manufactured in the same manner as in Example 1, except that a first auxiliary layer having a thickness of 250 Å A was formed by depositing NPB on the hole transporting blue emission layer, a red emission layer having a thickness of 400 Å was formed by co-depositing CBP and BPT1r on the first auxiliary layer at a weight ratio of 90:10, and then the HBL was formed on the red emission layer.

The organic light emitting diode showed current density of 13.8 mA/cm$^2$, and high luminance of 1934 cd/m$^2$ at a driving voltage of 4.2 V, and color coordinate was (0.687, 0.310) and emission efficiency was 14.0 cd/A.

Example 4

A substrate including a thin film transistor was prepared, and then a first electrode (reflective electrode) having a thickness of 1000 Å and comprising Al was formed in a stripe shape. Here, the first electrode was electrically connected to a source or drain electrode of the thin film transistor disposed below the substrate.

A pixel defining layer for defining each of regions for forming red, green, and blue emission layers was formed on the first electrode by using a silicon oxide, and a HIL (common layer) having a thickness of 200 Å was formed by depositing 2-TNATA.

Then, a hole transporting blue emission layer (common layer) having a thickness of 200 Å was formed by co-depositing Compound 1 and DPAVBi on the HIL at a weight ratio of 98:2.

Next, a first auxiliary layer having a thickness of 250 Å was formed on a red sub-pixel by deposing NPB on the hole transporting blue emission layer in the red sub-pixel, and then a red emission layer having a thickness of 400 Å was formed by co-depositing CBP and BTP1r on the first auxiliary layer at a weight ratio of 90:10. Then, a green emission layer having a thickness of 200 Å was formed in a green sub-pixel by co-depositing CBP and Ir(ppy)$_3$ on the hole transporting blue emission layer of the green sub-pixel at a weight ratio of 90:10.

Then, a HBL (common layer) having a thickness of 50 Å was formed by depositing Balq, an ETL (common layer) having a thickness of 200 Å was formed by depositing Alq$_3$ on the HBL, an EIL (common layer) having a thickness of 5 Å was formed by depositing LiF on the ETL, and then a second electrode (translucent electrode, common layer) having a thickness of 180 Å was formed by depositing Mg:Ag on the EIL, thereby manufacturing an organic light emitting diode emitting all of red, green, and blue lights.

Efficiency and a color coordinate of the organic light emitting diode of Example 4 were evaluated by using an IVL Measuring Device (PhotoResearch PR650, Keithley 238), and results thereof are shown in Table 1 below.

TABLE 1

|  | Efficiency (cd/A) | x color coordinate | y color coordinate |
|---|---|---|---|
| Red light | 14.3 | 0.68 | 0.32 |
| Green light | 28.9 | 0.22 | 0.69 |
| Blue light | 2.7 | 0.13 | 0.07 |

According to Table 1, the organic light emitting diode of Example 4 has improved efficiency and color purity according to each emitted color.

The organic light emitting diode of Example 4 showed 13.1 cd/A as efficiency of white light obtained by mixing red, green, and blue lights at luminance of 200 cd/m$^2$ and 40% diode on state, and thus power consumption was 165 mW based on this efficiency. The power consumption was calculated by evaluating and calculating efficiency and color purity of the organic light emitting diode of Example 4 by using an IVL measuring device (PhotoResearch PR650, Keithley 238).

Example 5

A first electrode (reflective electrode) was obtained by cutting an Al and ITO substrate (manufactured by SDI) having a thickness of 1300 Å to a size of 50 mm×50 mm×0.7 mm, washing the result product with ultrasonic waves in isopropyl alcohol and pure water respectively for 5 minutes, and then washing the result product with ultraviolet rays and ozone for 30 minutes. A HIL having a thickness of 1200 Å was formed by depositing 2-TNATA on the first electrode, a hole transporting blue emission layer having a thickness of 300 Å was formed by co-depositing Compound 21 and DPAVBi at a weight ratio of 98:2 on the HIL, and then a HBL having a thickness of 50 Å was formed by depositing Balq on the hole transporting blue emission layer. An ETL having a thickness of 250 Å was formed by depositing Alq$_3$ on the HBL, and then an EIL having a thickness of 10 Å was formed by depositing LiF. Then, an organic light emitting diode (blue light emission) was manufactured by forming a second electrode (translucent electrode) having a thickness of 180 Å by depositing Mg:Ag on the EIL.

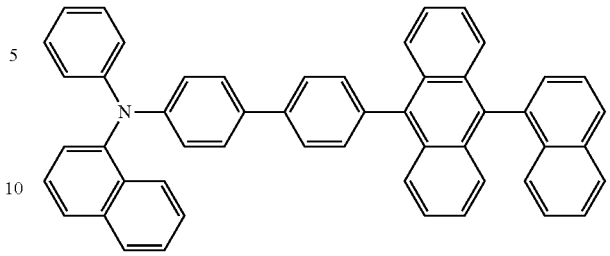

<Compound 21>

The organic light emitting diode showed current density of 26.0 mA/cm$^2$, and high luminance of 1103 cd/m$^2$ at a driving voltage of 5.5 V, and color coordinate was (0.133, 0.110) and emission efficiency was 4.24 cd/A.

Example 6

An organic light emitting diode (green light emission) was manufactured in the same manner as in Example 5, except that a green emission layer having a thickness of 400 Å was formed by co-depositing CBP and Ir(ppy)$_3$ on the hole transporting blue emission layer at a weight ratio of 90:10, and then the HBL was formed.

The organic light emitting diode showed current density of 8.3 mA/cm$^2$, and high luminance of 2152 cd/m$^2$ at a driving voltage of 6.5 V, and color coordinate was (0.238, 0.691) and emission efficiency was 25.9 cd/A.

Example 7

An organic light emitting diode (red light emission) was manufactured in the same manner as in Example 5, except that a first auxiliary layer having a thickness of 400 Å was formed by depositing NPB on the hole transporting blue emission layer, a red emission layer having a thickness of 300 Å was formed by co-depositing CBP and BPT1r on the first auxiliary layer at a weight ratio of 90:10, and then the HBL was formed on the red emission layer.

The organic light emitting diode showed current density of 12.1 mA/cm$^2$, and high luminance of 1643 cd/m$^2$ at a driving voltage of 6.2 V, and color coordinate was (0.678, 0.320) and emission efficiency was 13.58 cd/A.

Example 8

A substrate including a thin film transistor was prepared, and then a first electrode having a thickness of 1000 Å and comprising Al was formed in a stripe shape. Here, the first electrode was electrically connected to a source or drain electrode of the thin film transistor disposed below the substrate.

A pixel defining layer for defining each of red, green, and blue sub-pixels was formed on the first electrode by using a silicon oxide, and a HIL (common layer) having a thickness of 1200 Å was formed by co-depositing 2-TNATA along the pixel defining layer.

Then, a hole transporting blue emission layer (common layer) having a thickness of 300 Å was formed by co-depositing Compound 21 and DPAVBi on the HIL at a weight ratio of 98:2.

Next, a first auxiliary layer having a thickness of 300 Å was formed by deposing NPB on the hole transporting blue emission layer in the red sub-pixel, and then a red emission layer having a thickness of 300 Å was formed by co-depositing CBP and BTP1r on the first auxiliary layer at a weight ratio of 90:10. Then, a green emission layer having a thickness of 300 Å was formed by co-depositing CBP and Ir(ppy)₃ on the hole transporting blue emission layer of the green sub-pixel at a weight ratio of 90:10.

Then, a HBL (common layer) having a thickness of 50 Å was formed by depositing Balq, an ETL (common layer) having a thickness of 250 Å was formed by depositing Alq₃ on the HBL, an EIL (common layer) having a thickness of 10 Å was formed by depositing LiF on the ETL, and then a second electrode (translucent electrode, common layer) having a thickness of 180 Å was formed by depositing Mg:Ag on the EIL, thereby manufacturing an organic light emitting diode emitting all of red, green, and blue lights.

Efficiency and a color coordinate of the organic light emitting diode of Example 8 were evaluated by using an IVL Measuring Device (PhotoResearch PR650, Keithley 238), and results thereof are shown in Table 2 below.

TABLE 2

| | Efficiency (cd/A) | x color coordinate | y color coordinate |
|---|---|---|---|
| Red light | 13.6 | 0.68 | 0.32 |
| Green light | 26.5 | 0.22 | 0.71 |
| Blue light | 2.7 | 0.14 | 0.06 |

According to Table 2, the organic light emitting diode of Example 8 has improved efficiency and color purity according to each emitted color. The organic light emitting diode of Example 8 showed 13.3 cd/A as efficiency of white light obtained by mixing red, green, and blue lights at luminance of 200 cd/m² and 40% diode on state, and thus power consumption was 187.3 mW based on this efficiency. The power consumption was calculated by evaluating and calculating efficiency and color purity of the organic light emitting diode of Example 8 by using an IVL measuring device (PhotoResearch PR650, Keithley 238).

Example 9

An organic light emitting diode was manufactured in the same manner as in Example 8, except that a hole transporting blue emission layer (common layer) having a thickness of 300 Å was formed by co-depositing Compound 27 and DPAVBi on the HIL at a weight ratio of 98:2, instead of Compound 21 and DPAVBi.

<Compound 27>

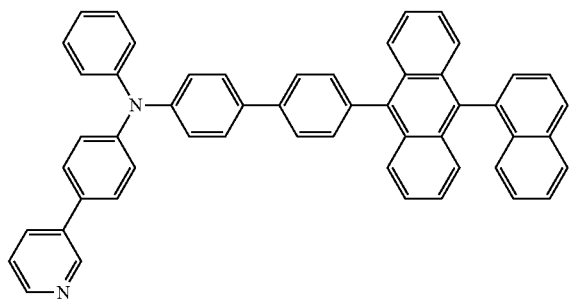

Efficiency and a color coordinate of the organic light emitting diode of Example 9 were evaluated by using an IVL Measuring Device (PhotoResearch PR650, Keithley 238), and results thereof are shown in Table 3 below.

TABLE 3

| | Efficiency (cd/A) | x color coordinate | y color coordinate |
|---|---|---|---|
| Red light | 15.4 | 0.67 | 0.34 |
| Green light | 28.1 | 0.23 | 0.69 |
| Blue light | 3.8 | 0.14 | 0.08 |

Comparative Example 1

A substrate including a thin film transistor was prepared, and then a first electrode (reflective electrode) having a thickness of 1000 Å and comprising Al was formed in a stripe shape. Here, the first electrode is electrically connected to a source or drain electrode of the thin film transistor disposed below the substrate.

A pixel defining layer for defining each of regions for forming red, green, and blue emission layers was formed on the first electrode by using a silicon oxide, a HIL (common layer) having a thickness of 1000 Å was formed by depositing 2-TNATA along the pixel defining layer, and then NPB having a thickness of 400 Å was deposited on the HIL. Then, NPB having a thickness of 400 Å was further deposited in a greens sub-pixel and NPB having a thickness of 800 Å was further deposited in a red sub-pixel by using a photo mask, so that the thickness of the HTL in the red sub-pixel is 1200 Å, the thickness of the HTL in the green sub-pixel is 800 Å, and the thickness of the HTL in the blue sub-pixel is 400 Å.

Next, the red emission layer having a thickness of 300 Å was formed by co-depositing CBP and BTP1r on the HTL in the red sub-pixel at a weight ratio of 90:10, the green emission layer having a thickness of 300 Å was formed by co-depositing CBP and Ir(ppy)₃ on the HTL in the green sub-pixel at a weight ratio of 90:10, and the blue emission layer having a thickness of 150 Å was formed by co-depositing AND and DPAVBi on the HTL in the blue sub-pixel at a weight ratio of 90:10.

Then, a HBL (common layer) having a thickness of 50 Å was formed by depositing Balq, an ETL (common layer) having a thickness of 250 Å was formed by depositing Alq₃ on the HBL, an EIL (common layer) having a thickness of 5 Å was formed by depositing LiF on the ETL, and then a second electrode (translucent electrode, common layer) having a thickness of 180 Å was formed by depositing Mg:Ag on the EIL, thereby manufacturing an organic light emitting diode (red, green, and blue lights emission).

Efficiency and a color coordinate of the organic light emitting diode of were evaluated by using an IVL Measuring Device (PhotoResearch PR650, Keithley 238), and results thereof are shown in Table 4 below.

TABLE 4

| | Efficiency (cd/A) | x color coordinate | y color coordinate |
|---|---|---|---|
| Red light | 5.39 | 0.67 | 0.32 |
| Green light | 24.45 | 0.21 | 0.72 |
| Blue light | 1.4 | 0.14 | 0.06 |

According to Tables 1 through 4, the efficiencies and color purities of red, green, and blue lights of the organic light emitting diodes of Examples 4 through 9 are improved compared to the efficiency and color purity of red, green, and blue lights of the organic light emitting diode of Comparative Example 1.

The organic light emitting diode of the present embodiments not only has high efficiency and high color purity, but also has simple manufacturing processes.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. An organic light emitting diode comprising:
a substrate comprising a first sub-pixel, a second sub-pixel, and a third sub-pixel;
a first electrode connected to the first, second, and third sub-pixels of the substrate;
a second electrode facing the first electrode;
a first emission layer disposed between the first electrode and the second electrode in the first sub-pixel, and emitting a first color light;
a second emission layer disposed between the first electrode and the second electrode in the second sub-pixel, and emitting a second color light; and
a hole transporting third emission layer being a common layer disposed throughout the first sub-pixel, the second sub-pixel, and the third sub-pixel,
wherein the first electrode is a reflective electrode and the second electrode is a translucent electrode, or the first electrode is a translucent electrode and the second electrode is a reflective electrode.

2. The organic light emitting diode of claim 1, wherein the hole transporting third emission layer comprises at least one of a compound represented by Formula 1 below and a compound represented by Formula 2 below:

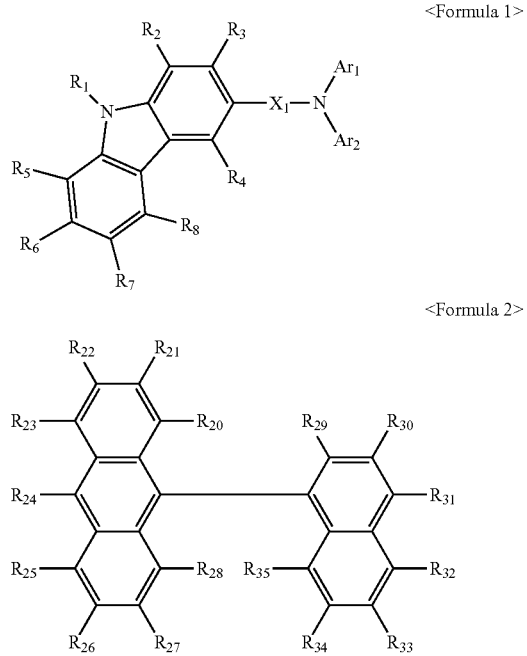

<Formula 1>

<Formula 2> wherein, in Formulas 1 and 2,
each of $R_1$ through $R_8$ and $R_{20}$ through $R_{35}$ is independently one of hydrogen, deuterium, tritium, a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_5$-$C_{50}$ aryl group, a substituted or unsubstituted $C_5$-$C_{50}$ aryloxy group, a substituted or unsubstituted $C_5$-$C_{50}$ arylthio group, a substituted or unsubstituted $C_2$-$C_{50}$ heteroaryl group, $-(X_2)_a$-$N(R_{40})(R_{41})$, and $(X_3)_b$-$Si(R_{42})(R_{43})(R_{44})$;
each of $X_1$ through $X_3$ is independently one of a substituted or unsubstituted $C_5$-$C_{50}$ arylene group and a substituted or unsubstituted $C_2$-$C_{50}$ heteroarylene group;
each of $Ar_1$ and $Ar_2$ is independently one of a substituted or unsubstituted $C_5$-$C_{50}$ aryl group and a substituted or unsubstituted $C_2$-$C_{50}$ heteroaryl group;
each of $R_{40}$ through $R_{44}$ is independently one of hydrogen, deuterium, tritium, a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_5$-$C_{50}$ aryl group, a substituted or unsubstituted $C_5$-$C_{50}$ aryloxy group, a substituted or unsubstituted $C_5$-$C_{50}$ arylthio group, and a substituted or unsubstituted $C_2$-$C_{50}$ heteroaryl group; and
each of a and b is independently an integer from 0 to 5.

3. The organic light emitting diode of claim 1, wherein the hole transporting third emission layer comprises at least one compound represented by Formula 1a or 1b below:

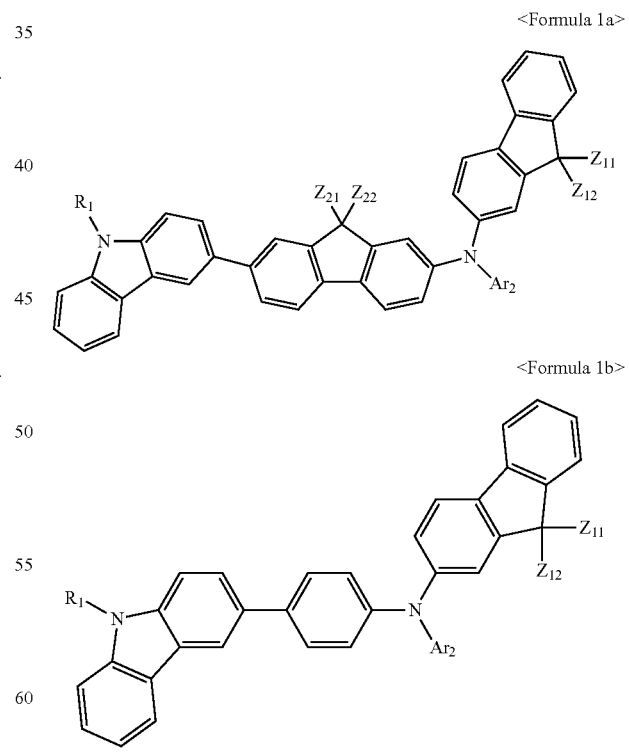

<Formula 1a>

<Formula 1b> wherein, $R_1$ is one of a phenyl group; a carbazolyl group; a fluorenyl group; a naphthyl group; an anthryl group; a pyridinyl group; a quinolinyl group; a benzoimidazolyl group; an imidazopyridinyl group; an imidazopyrimidinyl group; and a phenyl group, a carbazolyl group, a fluorenyl group, a naphthyl group, an anthryl group, a pyridinyl group, a quinolinyl group, a benzoimidazolyl group, an imidazopyridinyl group, or an imidazopyrimidinyl group substituted with at least one of deuterium, tritium, a halogen atom, a hydroxyl group, a cyano group, a $C_1$-$C_{10}$ alkyl group, a $C_1$-$C_{10}$ alkoxy group, a $C_6$-$C_{14}$ aryl group, and a $C_2$-$C_{14}$ heteroaryl group;

each of $Z_{11}$, $Z_{12}$, $Z_{21}$, and $Z_{22}$ is independently hydrogen, deuterium, tritium, a halogen atom, a methyl group, an ethyl group, a propyl group, a butyl group, a methoxy group, an ethoxy group, a propoxy group, a phenyl group, a naphthyl group, or an anthryl group; and $Ar_2$ is a phenyl group, a halogenated phenyl group, a $C_1$-$C_{10}$ alkylphenyl group, a di($C_1$-$C_{10}$ alkyl)phenyl group, a ($C_6$-$C_{14}$ aryl)phenyl group, a di($C_6$-$C_{14}$ aryl) phenyl group, a phenyl group substituted with a diarylamino group, a carbazolyl group, a halogenated carbazolyl group, a $C_6$-$C_{14}$ alkylcarbazolyl group, a di($C_1$-$C_{10}$ alkyl)carbazolyl group, a $C_6$-$C_{14}$ arylcarbazolyl group, a di($C_6$-$C_{14}$ aryl)carbazolyl group, a carbazolyl group substituted with a diarylamino group, a fluorenyl group, a halogenated fluorenyl group, a $C_1$-$C_{10}$ alkylfluorenyl group, a di($C_1$-$C_{10}$ alkyl)fluorenyl group, a ($C_6$-$C_{14}$ aryl) fluorenyl group, a di($C_6$-$C_{14}$ aryl)fluorenyl group, a fluorenyl group substituted with a diarylamino group, a naphthyl group, a halogenated naphthyl group, a $C_1$-$C_{10}$ alkylnaphthyl group, a di($C_1$-$C_{10}$ alkyl)naphthyl group, a ($C_6$-$C_{14}$ aryl)naphthyl group, a di($C_6$-$C_{14}$ aryl)naphthyl group, a naphthyl group substituted with a diarylamino group, an anthryl group, a halogenated anthryl group, a $C_1$-$C_{10}$ alkylanthryl group, a di($C_1$-$C_{10}$ alkyl) anthryl group, a ($C_6$-$C_{14}$ aryl) anthryl group, a di($C_6$-$C_{14}$ aryl)anthryl group, or an anthryl group substituted with a diarylamino group, wherein an aryl group of the diarylamino group is a phenyl group, a naphthyl group, or an anthryl group.

4. The organic light emitting diode of claim 1, wherein the hole transporting third emission layer comprises at least one compound represented by Formula 2a below:

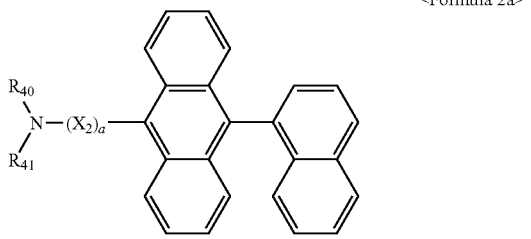

<Formula 2a> wherein, each of $R_{40}$ and $R_{41}$ is independently one of a phenyl group; a carbazolyl group; a fluorenyl group; a naphthyl group; an anthryl group; a pyridinyl group; a quinolinyl group; a benzoimidazolyl group; an imidazopyridinyl group; an imidazopyrimidinyl group; and a phenyl group, a carbazolyl group, a fluorenyl group, a naphthyl group, an anthryl group, a pyridinyl group, a quinolinyl group, a benzoimidazolyl group, an imidazopyridinyl group, or an imidazopyrimidinyl group substituted with at least one of deuterium, tritium, a halogen atom, a hydroxyl group, a cyano group, a $C_1$-$C_{10}$ alkyl group, a $C_1$-$C_{10}$ alkoxy group, a $C_6$-$C_{14}$ aryl group, and a $C_3$-$C_{14}$ heteroaryl group;

$X_2$ is a phenylene group, a $C_1$-$C_{10}$ alkylphenylene group, a di($C_1$-$C_{10}$ alkyl)phenylene group, a ($C_6$-$C_{14}$ aryl)phenylene group, or a di($C_6$-$C_{14}$ aryl)phenylene group; and a is 1 or 2.

5. The organic light emitting diode of claim 1, wherein the hole transporting third emission layer further comprises at least one of a phosphorescent dopant and a fluorescent dopant.

6. The organic light emitting diode of claim 1, wherein the first color light is a red light, the second color light is a green light, and a third color light emitted from the hole transporting third emission layer is a blue light.

7. The organic light emitting diode of claim 6, wherein the hole transporting third emission layer comprises a first region disposed in the first sub-pixel, a second region disposed in the second sub-pixel, and a third region disposed in the third sub-pixel, wherein the first region transports holes from the first electrode to the first emission layer, the second region transports holes from the first electrode to the second emission layer, and the third region emits the third color light.

8. The organic light emitting diode of claim 6, wherein the organic light emitting diode satisfies at least one of Equations 1 through 3 below:

$$\frac{\lambda_1}{2n_1} \cdot m_1 - \frac{\lambda_1}{10} \leq L_1 \leq \frac{\lambda_1}{2n_1} \cdot m_1 + \frac{\lambda_1}{10} \qquad < \text{Equation 1} >$$

$$\frac{\lambda_2}{2n_2} \cdot m_2 - \frac{\lambda_2}{10} \leq L_2 \leq \frac{\lambda_2}{2n_2} \cdot m_2 + \frac{\lambda_2}{10} \qquad < \text{Equation 2} >$$

$$\frac{\lambda_3}{2n_3} \cdot m_3 - \frac{\lambda_3}{10} \leq L_3 \leq \frac{\lambda_3}{2n_3} \cdot m_3 + \frac{\lambda_3}{10} \qquad < \text{Equation 3} >$$

wherein, in Equations 1 through 3, $L_1$ denotes a distance between the first electrode and the second electrode in the first sub-pixel;

$L_2$ denotes a distance between the first electrode and the second electrode in the second sub-pixel;

$L_3$ denotes a distance between the first electrode and the second electrode in the third sub-pixel;

$\lambda_1$, $\lambda_2$, and $\lambda_3$ respectively denote wavelengths of the first color light, the second color light, and the third color light;

$n_1$ denotes a refractive index of layers disposed between the first electrode and the second electrode in the first sub-pixel;

$n_2$ denotes a refractive index of layers disposed between the first electrode and the second electrode in the second sub-pixel;

$n_3$ denotes a refractive index of layers disposed between the first electrode and the second electrode in the third sub-pixel; and each of $m_1$, $m_2$, and $m_3$ is independently a natural number.

9. The organic light emitting diode of claim 8, wherein, in Equations 1 through 3, each of $m_1$, $m_2$, and $m_3$ is 1.

10. The organic light emitting diode of claim 9, wherein $D_1$ denotes a distance between the first electrode and the first emission layer in the first sub-pixel, and $D_1$ is in the range from 400 Å to 1000Å.

11. The organic light emitting diode of claim 9, wherein $D_2$ denotes a distance between the first electrode and the second emission layer in the second sub-pixel, and $D_2$ is in the range from 300 Å to 900 Å.

12. The organic light emitting diode of claim 9, wherein $D_3$ denotes a sum of a distance between the first electrode and the hole transporting third emission layer in the third sub-pixel and a thickness of the hole transporting third emission layer, and $D_3$ is in the range from 200 Å to 800 Å.

13. The organic light emitting diode of claim 8, wherein, in Equations 1 through 3, each of $m_1$, $m_2$, and $m_3$ is 2.

14. The organic light emitting diode of claim 13, wherein $D_1$ denotes a distance between the first electrode and the first emission layer in the first sub-pixel, and $D_1$ is in the range from 1600 Å to 2300 Å.

15. The organic light emitting diode of claim 13, wherein $D_2$ denotes a distance between the first electrode and the second emission layer in the second sub-pixel, and $D_2$ is in the range from 1300 Å to 2000 Å.

16. The organic light emitting diode of claim 13, wherein $D_3$ denotes a sum of a distance between the first electrode and the hole transporting third emission layer in the third sub-pixel and a thickness of the hole transporting third emission layer, and $D_3$ is in the range from 900 Å to 1800 Å.

17. The organic light emitting diode of claim 8, wherein $D_1$ denotes a distance between the first electrode and the first emission layer in the first sub-pixel, $D_2$ denotes a distance between the first electrode and the second emission layer in the second sub-pixel, $D_3$ denotes a sum of a distance between the first electrode and the hole transporting third emission layer in the third sub-pixel and a thickness of the hole transporting third emission layer, and $D_1 > D_2 = D_3$.

18. The organic light emitting diode of claim 8, wherein $D_1$ denotes a distance between the first electrode and the first emission layer in the first sub-pixel, $D_2$ denotes a distance between the first electrode and the second emission layer in the second sub-pixel, $D_3$ denotes a sum of a distance between the first electrode and the hole transporting third emission layer in the third sub-pixel and a thickness of the hole transporting third emission layer, and $D_1 > D_2 > D_3$.

19. The organic light emitting diode of claim 6, wherein a first auxiliary layer is disposed between the hole transporting third emission layer and the first emission layer.

20. The organic light emitting diode of claim 1, wherein a hole injection layer or a functional layer having both a hole injection function and a hole transport function is disposed between the hole transporting third emission layer and the first electrode, and the hole injection layer or the functional layer contacts the hole transporting third emission layer.

* * * * *